United States Patent
Psychogiou et al.

(10) Patent No.: US 11,621,700 B2
(45) Date of Patent: Apr. 4, 2023

(54) NON-RECIPROCAL RF-BANDPASS FILTERS

(71) Applicant: The Regents of the University of Colorado, a body corporate, Denver, CO (US)

(72) Inventors: Dimitra Psychogiou, Boulder, CO (US); Andrea M. Ashley, Frederick, CO (US)

(73) Assignee: Regents of the University of Colorado, a body corporate, Denver, CO (US)

( * ) Notice: Subject to any disclaimer, the term of this patent is extended or adjusted under 35 U.S.C. 154(b) by 0 days.

(21) Appl. No.: 17/492,401

(22) Filed: Oct. 1, 2021

(65) Prior Publication Data

US 2022/0109430 A1    Apr. 7, 2022

Related U.S. Application Data

(60) Provisional application No. 63/086,462, filed on Oct. 1, 2020.

(51) Int. Cl.
*H03H 11/04* (2006.01)
*H01P 1/36* (2006.01)

(52) U.S. Cl.
CPC .............. *H03H 11/04* (2013.01); *H01P 1/36* (2013.01)

(58) Field of Classification Search
None
See application file for complete search history.

(56) References Cited

U.S. PATENT DOCUMENTS 5,781,084 A * 7/1998 Rhodes ............... H01P 1/20
                                                    333/202
2010/0060388 A1* 3/2010 Ueda ................ H01P 1/203
                                                    333/236

FOREIGN PATENT DOCUMENTS

JP         H0522056 A  *  1/1993  ............... H03F 3/60

OTHER PUBLICATIONS

Swanson et al., "Microwave Filter Design by Synthesis and Optimization", IEEE Xplore, Apr. 2007. all pages (Year: 2007).*

* cited by examiner

*Primary Examiner* — Daniel C Puentes
(74) *Attorney, Agent, or Firm* — Macheledt Bales LLP; Jennifer L. Bales

(57) ABSTRACT

RF co-designed bandpass filters/isolators (BPFIs) are based on series-cascaded non-reciprocal resonant stages, microwave resonators and multi-resonant cells. The non-reciprocal stages are shaped by an in-parallel cascaded transistor-based path and a transmission line (TL) that result in a zero-phase resonance in the forward direction and high isolation in the reversed one. This includes coupling routing diagrams (CRDs) of BPFs that result in low- and high-order transfer functions with and without transmission zeros in their forward direction and high levels of isolation in the reverse one. BPFIs provide alternative-type of filtering responses (e.g., flat-passband, quasi-elliptic) with and without gain in the forward direction and high levels of isolation in the reversed one. BPFIs include five planar microstrip/lumped element (LE) prototypes using hybrid combinations of non-reciprocal resonant stages, microwave resonators and multi-resonant cells.

19 Claims, 18 Drawing Sheets

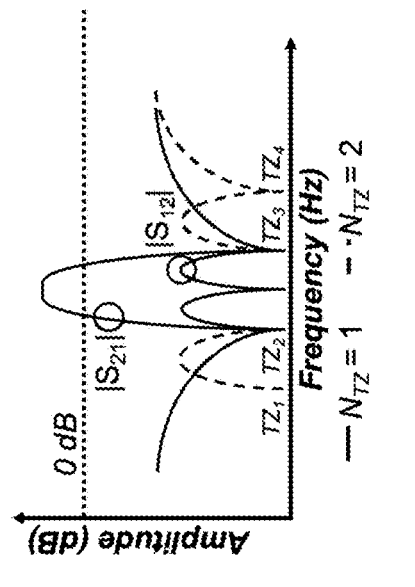
Figure 2C
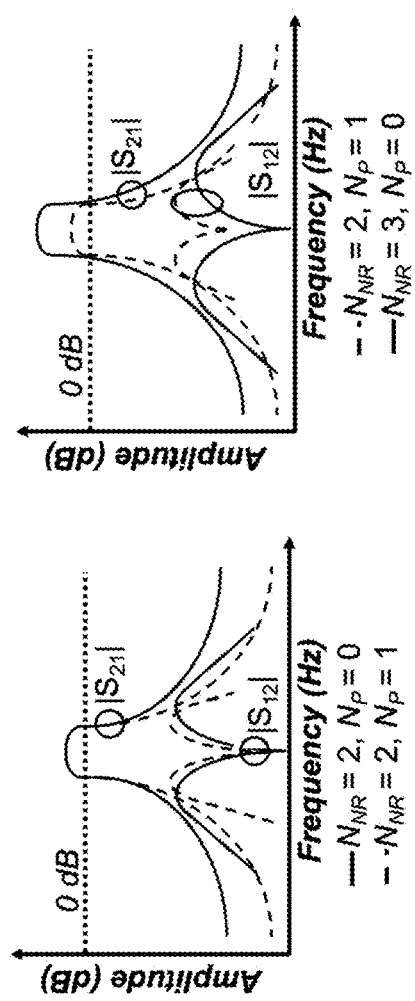
Figure 2D
Figure 2E
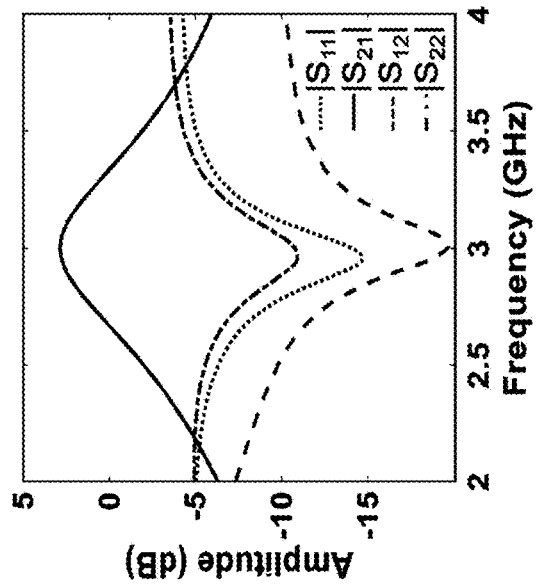
Figure 3B
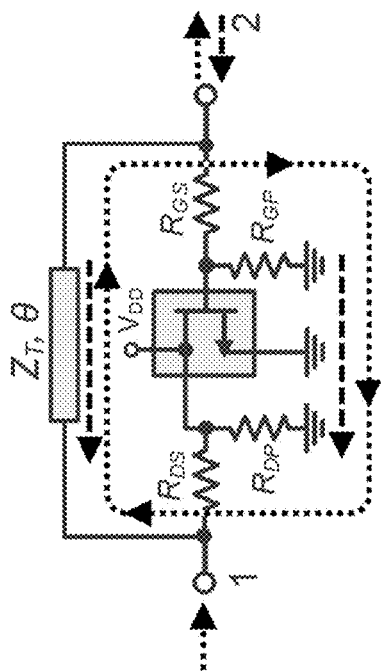
Figure 3A Topology D Topology E Topology F Topology G

NON-RECIPROCAL RF-BANDPASS FILTERS

BACKGROUND OF THE INVENTION

Field of the Invention

The present invention relates to non-reciprocal RF microwave bandpass filters (BPFs). The present invention further relates to RF co-designed bandpass filters/isolators (BPFIs).

Discussion of Related Art

Currently, full-duplex transceivers are increasingly attracting considerable attention for use in a plethora of wireless-communication, radar, and electronic-warfare applications due to their ability to simultaneously transmit and receive RF signals over the same frequency channel. This capability effectively results in doubling the channel capacity and reducing the RF transceiver size due to the use of a single antenna element in the RF transceiver. In order to achieve the simultaneous, transmit/receive function, non-reciprocal RF elements such as isolators or circulators are added between the antenna element and the RF filtering stages of the RF front-end chains. However, this approach results in large physical size RF transceivers and increased levels of integration complexity due to the need for bulky ferromagnetic elements that can't be easily integrated with the rest of its integrated-circuit (IC)-based components.

A need remains for non-reciprocal RF bandpass filters.

SUMMARY OF THE INVENTION

It is an object of the present invention to provide non-reciprocal RF filters. Such filters may combine the properties of an RF bandpass filter (BPF) and an isolator within the same device volume. The invention relates to a new class of microwave components, the so-called RF co-designed bandpass filters/isolators (BPFIs) that aim to reduce the physical footprint of the RF front-end and improve its power loss.

An embodiment is based on in-series cascaded non-reciprocal resonant stages—N for an N-pole BPF response—and transmission line (TL)-based impedance inverters. Each resonant stage contributes to a non-reciprocal resonance that results in enhanced power transmission response from port 1-to-port 2—forward direction—and full RF signal cancellation from port 2-to-port 1—reverse direction—. As in any conventional BPF design, the TL inverters set the location of the poles in the BPF passband, which in turn, define the transfer-function type, the passband bandwidth (BW) and its corresponding matching levels.

The non-reciprocity in the resonant stage is achieved by cascading in-parallel a transistor-based stage and a TL-based element with opposite phase responses. The transistor-based stage is shaped by four resistors and a pHEMT transistor in common-source (CS) configuration that exhibits a positive phase response. Two of the resistors are used for matching purposes and the other two control the stability of the transistor-based stage. Taking into consideration that TL-based elements exhibit a negative phase response, by appropriately selecting the TL characteristics a zero-phase resonance can be achieved in the overall resonator-ring—shaped by the TL and the transistor-based stage—when the RF signal is injected in Port 1. In addition, due to the presence of the CS-based pHEMT stage and the TL feedback between the gate and drain of the transistor, enhanced power transmission—i.e. gain—may be observed in the resonator output. On the contrary, when the RF signal is injected at Port 2, the RF signals that arrive in the resonator output—Port 1—are mutually-cancelled through destructive RF signal cancellation.

This invention includes design and practical implementation methods that lead to a new RF front-end/transceiver component that exhibits the function of a BPF and an RF isolator. The proposed non-reciprocal BPF or BPFI is meant to be used in various full-duplex RF communication, radar and instrumentation systems as a replacement of conventional magnetic-based circulator/isolator components that are large in size and have been hindering the practical development and commercialization of many of these systems. Features include co-located RF functions of bandpass filtering and isolation, high-order transfer function designs in the forward direction, increased out-of-band selectivity in the forward direction, increased gain in the forward direction and increased isolation in the reverse direction. Such RF front-end components have an overall size and loss smaller than the sum of its parts (e.g., filter and isolator). Non-reciprocity is achieved without the need of magnetic-biasing, which makes the device even smaller. Embodiments use commercially-available transistors and PCB manufacturing technologies.

A non-reciprocal RF filter includes at least one non-reciprocal resonator and another resonator, which might be another non-reciprocal resonator, a passive resonator, or a multi-resonant cell. Generally the filter is cascaded in series. Such a filter might have a single maximum isolation point, or, in the case of more than one non-reciprocal resonator, multiple isolation points. It could provide gain or no gain.

The non-reciprocal resonator comprises in parallel a transistor-based element and a transmission line (TL)-based element having an opposite phase response to the transistor-based element. For example, the transistor-based element includes four resistors and a pHEMT transistor in common-source (CS) configuration that exhibits a positive phase response and the TL-based element exhibits a negative response. It may form an RF bandpass filter and an isolator within the same device volume. It is capable of providing a center frequency and an isolation frequency that is different than the center frequency.

A method of modeling such non-reciprocal filters models the non-reciprocal element using network parameters based on a coupling matrix, node admittances, resonating nodes, for example S-parameters, Y-parameters, Z-parameters, and/or ABCD parameters. Any passive resonators or multi-resonant cells are also modeled.

BRIEF DESCRIPTION OF THE DRAWINGS

FIG. 2C is a plot showing conceptual power transmission (of the forward direction $|S_{21}|$) and isolation (of the reverse direction $|S_{12}|$) responses when different numbers of passive resonators ($N_P$) are used in the BPFI while keeping the number of non-reciprocal resonators ($N_{NR}$) the same which results in increased selectivity in the forward direction. FIG. 2D is a plot showing conceptual change in isolation of the reverse direction and on the gain levels of the forward direction when different numbers of non-reciprocal resonant stages ($N_{NR}$) are used in the BPFI, while the BPFI order (or total number of resonators) remains unchanged. FIG. 2E is a plot showing conceptual change in the out-of-band isolation of the forward direction when different numbers of multi-resonant cells ($N_{TZ}$) are used in the BPFI.

FIG. 3A is a schematic circuit diagram of a non-reciprocal resonating stage according to the present invention. FIG. 3B is a plot showing simulated power transmission, isolation, and reflection responses of the device of FIG. 3A.

DETAILED DESCRIPTION OF THE INVENTION

Figures 1A, 1B:
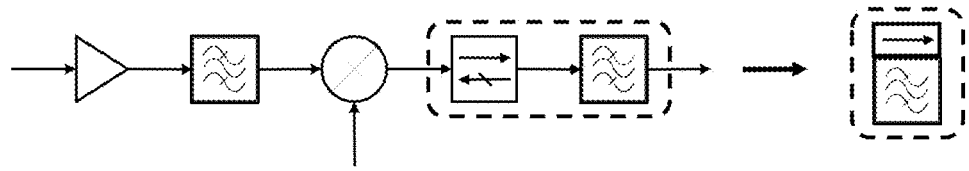
FIG. 1A (prior art) is a schematic block diagram of a conventional RF front-end architecture.
FIG. 1B is a schematic block diagram of a bandpass filter/isolator (BPFI) according to the present invention.

A new class of RF co-designed BPFs/isolators (BPFIs) exhibit the combined functionality of a highly-selective BPF and an RF isolator and aim to reduce the RF front-end size as shown in the block diagrams of FIG. 1A and FIG. 1B. The proposed BPFIs are based on series cascaded non-reciprocal resonant stages, multi-resonant cells and passive reciprocal resonators that facilitate the realization of quasi-elliptic transfer functions with or without enhanced power transmission response (i.e., gain) in the forward direction and high levels of isolation in the reverse one. See FIG. 2A-2E. The operating principles of the non-reciprocal resonant stage are presented through circuit-based examples and coupled-resonator diagrams (CRDs) that enable their design with coupled resonator-based filter synthesis. See FIGS. 3A-17B. These embodiments provide high-order transfer functions with highly-selective quasi-elliptic type power transmission response in the forward direction, hybrid integration schemes using high- and low-quality factor (Q) resonators and multi-resonant cells, and high and wide levels of isolation in the reversed direction. Various RF co-designed BPF/isolator prototypes that demonstrate the validity of the BPFI concept and its applicability to the realization scalable transfer functions in terms of selectivity, power transmission and isolation response are shown and described. See FIGS. 18A-22B.

Provisional application for patent app. No. 63/086,462 filed on 1 Oct. 2020 and entitled "Non-Reciprocal RF-Bandpass Filters Using Transistor-Based Microwave Resonators" is incorporated herein by reference.

FIG. 1A (prior art) is a schematic block diagram of a conventional RF front end architecture. The isolator and RF BPF are shown in the dotted box. FIG. 1B is a schematic block diagram of a bandpass filter/isolator (BPFI) according to the present invention, wherein the functions of the RF BPF and isolator are combined into a single component within the dotted box.

Figure 2A:
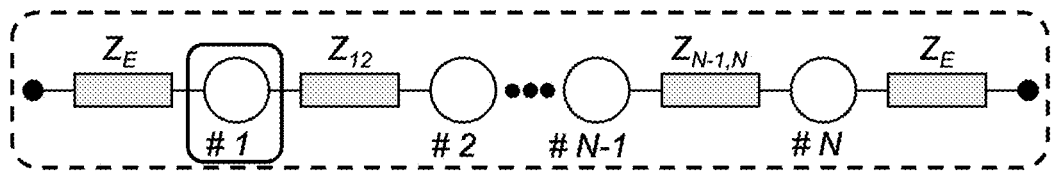
FIG. 2A is a schematic block diagram of an RF co-designed BPFI according to the present invention.

FIG. 2A is a schematic block diagram of an RF co-designed BPFI according to the present invention. It is based on N in-series cascaded resonant elements (white circles) that can comprise different resonator types (see FIG. 2B) with the purpose of obtaining different transfer function profiles in the forward and in the reverse direction. In order to combine these functionalities and create a highly-selective filtering response with high levels of isolation (IS) in the reverse direction, various topologies of series-cascaded passive microwave resonators, non-reciprocal resonant stages, and/or multi-resonant cells (and transmission lines (TLs)) can be formulated as shown in FIG. 2B.

Figure 2B:
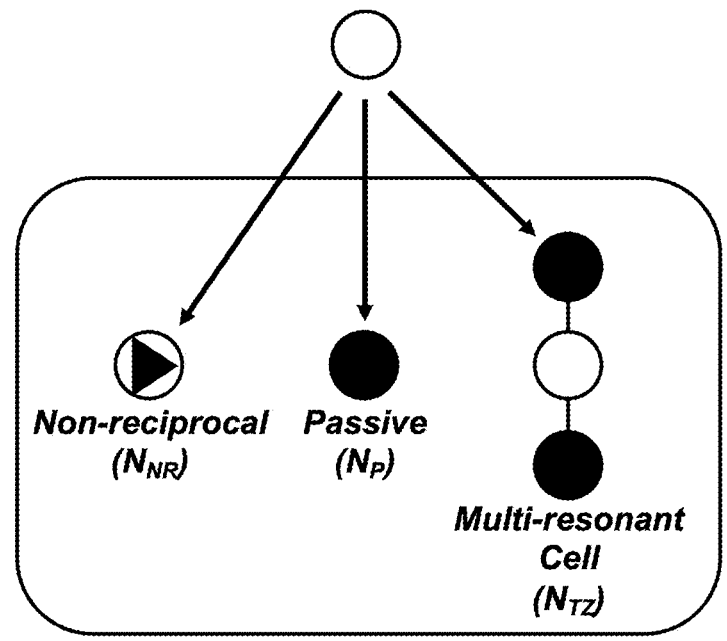
FIG. 2B is a schematic diagram of the different types of resonant elements that can be used in the BPFI architecture of FIG. 2A.

FIG. 2B is a schematic diagram of the different type of the resonant elements that can be used in the architecture of FIG. 2A. The resonant elements include non-reciprocal resonant stages $N_{NR}$ (white circle with triangle), microwave passive resonators $N_P$ (black circle), and multi-resonant cells $N_{TZ}$ (white circle: non-resonating node (NRN) and black circles: resonating nodes). They respectively create, one pole (with and without gain) in the forward direction and one transmission zero (TZ) in the reverse one, one pole in both the forward and reverse direction and one pole and two TZs in both the forward and reverse direction.

FIG. 2C is a plot showing conceptual power transmission and isolation responses when the number of the passive resonators $N_P$ is altered in the BPFI. Solid line plots indicate $N_{NR}=2$ and $N_P=0$. Dotted lines indicate $N_{NR}=2$ and $N_P=1$. The filter order can be increased while maintaining the same forward power transmission—can be designed with and without gain—in the passband and similar reverse isolation levels by increasing the number of passive resonators within the filter volume.

FIG. 2D is a plot showing conceptual change in isolation and gain levels with when the number of non-reciprocal resonant stages $N_{NR}$ is altered in the BPFI. Solid line plots indicate $N_{NR}=3$ and $N_P=0$. Dotted lines indicate $N_{NR}=2$ and $N_P=1$. For a given selectivity in the forward direction, the gain in the forward direction and the isolation levels in the reversed one are altered by increasing the number of the non-reciprocal resonant stages within the filter volume.

FIG. 2E is a plot showing conceptual change in out-of-band isolation when the number of multi-resonant cells $N_{TZ}$ is altered in the BPFI. Solid line plots indicate $N_{TZ}=1$. Dotted lines indicate $N_{TZ}=2$. An increase in the out-of-band isolation of the forward and reverse direction is achieved by incorporating multi-resonant cells that generate transmission zeros (TZs) into the filter topology.

FIG. 3A is a schematic circuit diagram of a non-reciprocal resonating stage according to the present invention. It is based on the parallel combination of two RF signal paths that result in a zero-phase resonance at the design frequency of interest (3 GHz in this example, see FIG. 3B). In this manner, a single pole frequency-selective transmission is obtained in the forward direction and destructive signal cancellation (i.e., isolation) in the reverse one. The transistor-based path is shaped by four resistors ($R_{GS}$, $R_{GP}$, $R_{DS}$, $R_{DP}$) and a transistor in common-source (CS) configuration that exhibits a positive phase, in the case of a commercially-available pHEMT transistor. By taking into consideration the negative phase characteristics of TLs and appropriately selecting their lengths, a zero-phase resonance is obtained in the forward direction of the resonant stage and resonant destructive signal cancellation in the reversed one as shown in FIG. 3B. Furthermore, by appropriately selecting the operational point of the transistor, the power transmission response in the forward direction can be designed with or without gain.

FIG. 3B is a plot showing simulated power transmission ($|S_{21}|$), isolation ($|S_{12}|$), and reflection ($|S_{11}|$, $|S_{22}|$) responses of the device of FIG. 3A.

Figure 4A:
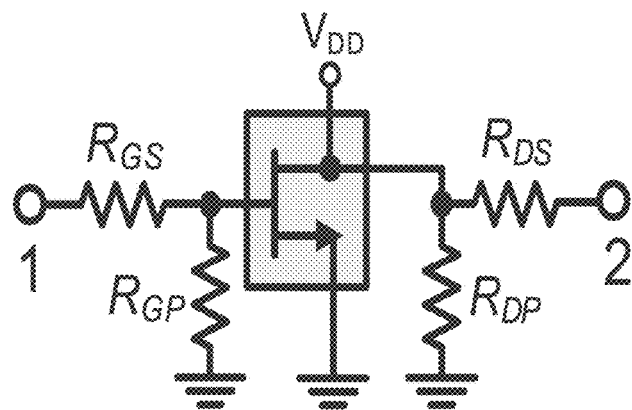
FIG. 4A is a schematic circuit diagram of an example of a transistor-based stage for use in the device of FIG. 3A.
Figure 4B:
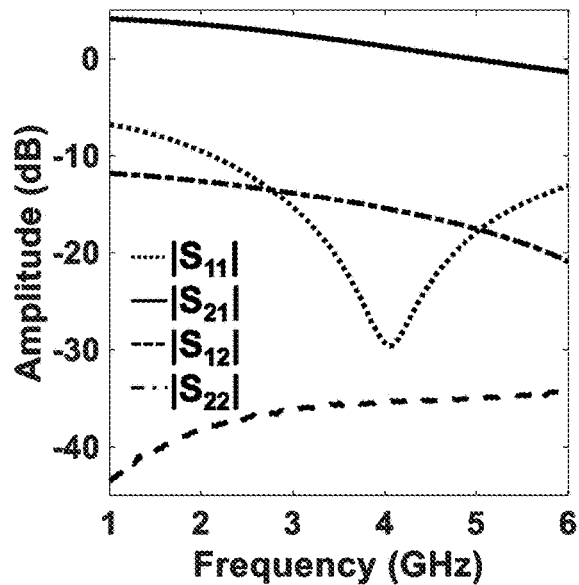
FIG. 4B is a plot showing simulated amplitude response of the element of FIG. 4A.
Figure 4C:
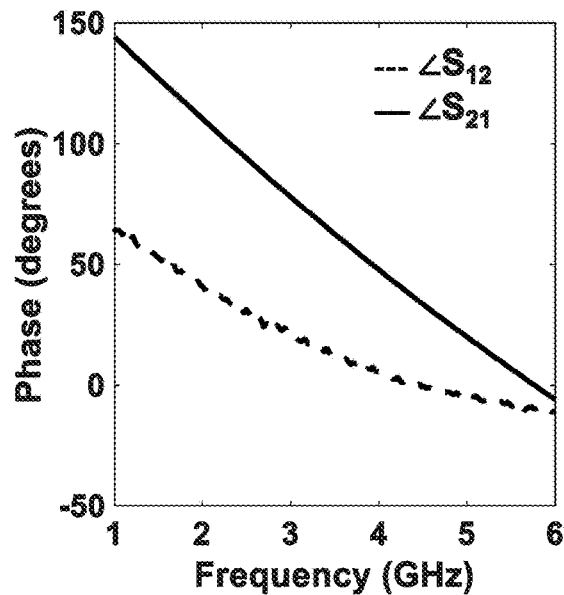
FIG. 4C is a plot showing simulated phase response of the element of FIG. 4A.

FIG. 4A is a schematic circuit diagram of an example of a transistor-based element for use in the non-reciprocal resonating stage of FIG. 3A. FIG. 4B is a plot showing simulated S-parameter response (amplitude) of the element of FIG. 4A. FIG. 4C is a plot showing simulated phase response of the element of FIG. 4A. The non-reciprocal resonant stage is first designed by choosing an operating frequency and by shaping the pHEMT's response with four resistors ($R_{GS}$, $R_{GP}$, $R_{DS}$, $R_{DP}$).

In particular, the values of the resistors are determined as a compromise between gain, stability, and matching. In this example, an operating frequency of 3 GHz and a bias point of $V_{DD}=2V$, $I_{DD}=20$ mA is chosen. To enable gain and good match at the center frequency, the resistor values were selected as follows: $R_{GS}=42.1\Omega$, $R_{GP}=110.2\Omega$, $R_{DS}=34.4\Omega$, and $R_{DP}=56.5\Omega$. This results in the amplitude and phase responses in FIG. 4. Since the phase of the transistor-based path is ~+80°, the TL needs to be selected with the reverse phase at the design frequency so that a zero-phase resonance can be obtained.

Figures 5A, 5B:
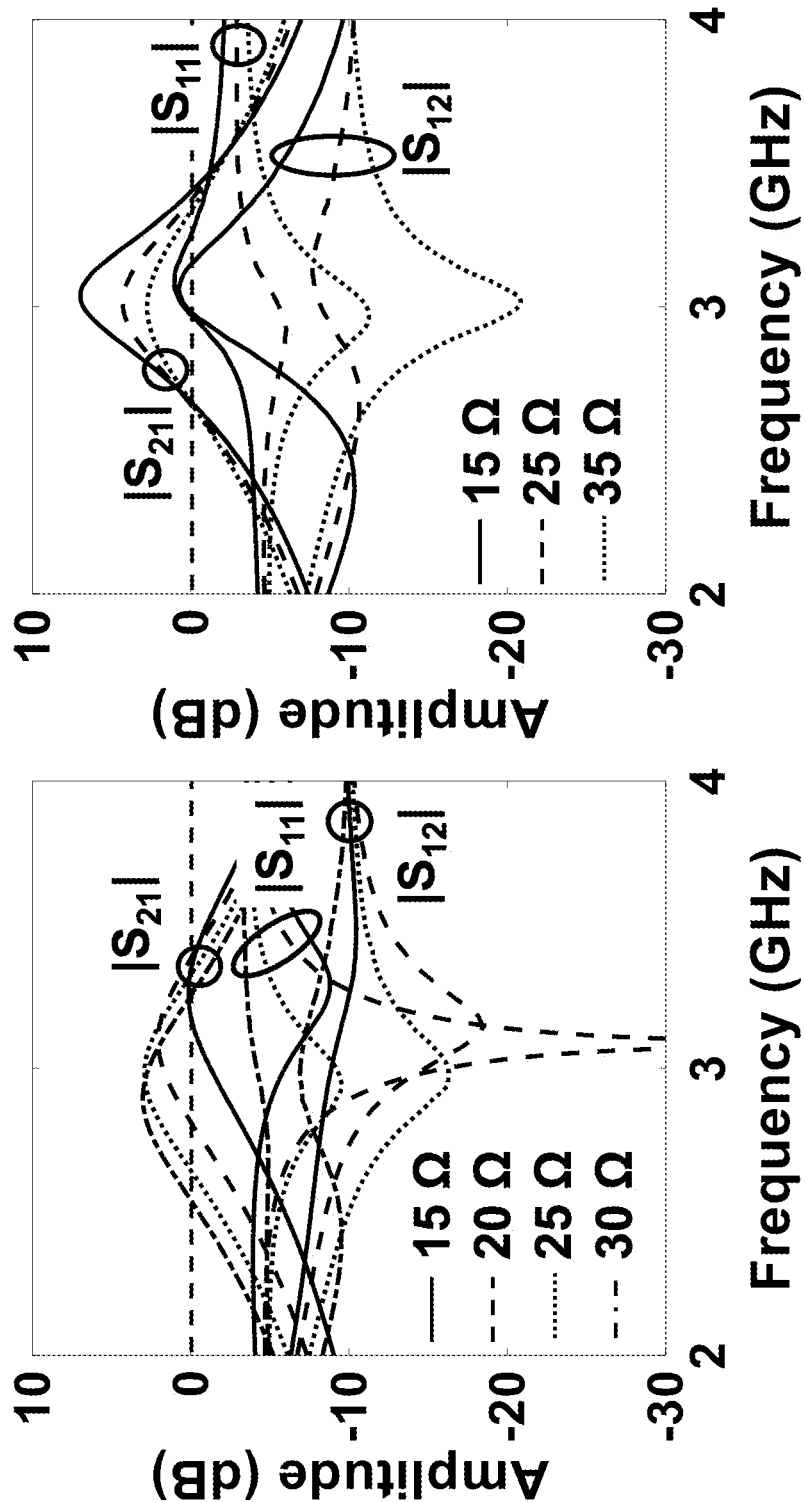
FIG. 5A is a plot showing RF power transmission, isolation, and reflection response of the non-reciprocal resonant stage of FIG. 3A as a function of transmission line impedance ($Z_T$) in the element of FIG. 3A.
FIG. 5B shows this response as a function of resistance of a resistor ($R_{DS}$) in the element.

FIG. 5A is a plot showing RF power transmission, isolation, and reflection response of the non-reciprocal resonant stage of FIG. 3A as a function of transmission line impedance $Z_T$ in the element of FIG. 3A.

Figures 5C, 5D:
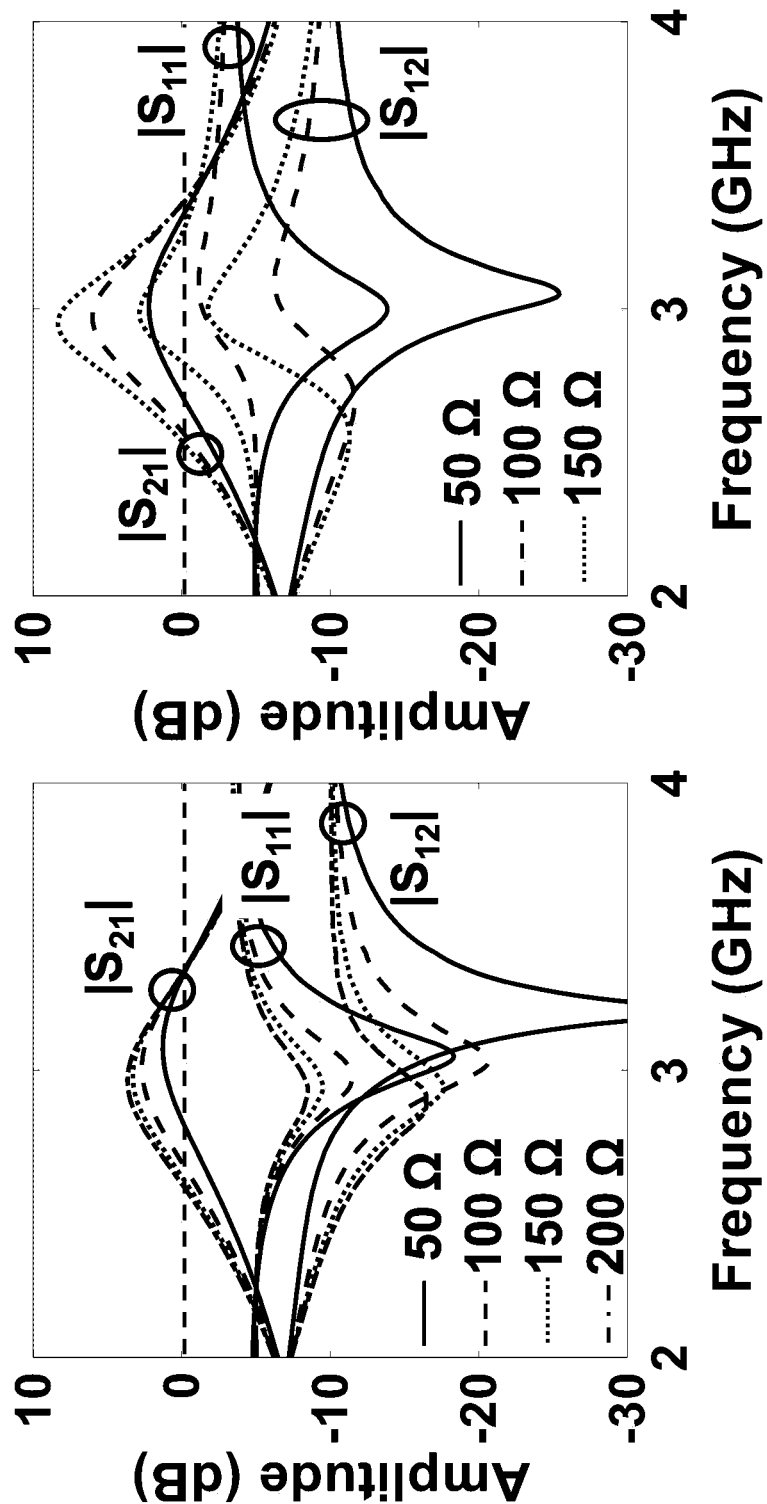
FIG. 5C shows this response as a function of resistance of another resistor ($R_{GP}$).
FIG. 5D shows this response as a function of resistance of another resistor ($R_{DP}$).

FIG. 5B shows this response as a function of resistance of resistor $R_{DS}$. FIG. 5C shows this response as a function of resistance of resistor $R_{GP}$. FIG. 5D shows this response as a function of resistance of resistor $R_{DP}$. It can be seen that the $Z_T$ and $R_{GP}$ affect the overall performance and $R_{DP}$ and $R_{DS}$ control stability.

When not mentioned, the rest of the resonant-stage parameters are set as: $Z_T=24.2$ $\Omega$, $\theta=86°$, $R_{GS}=42.1\Omega$, $R_{GP}=110.2\Omega$, $R_{DS}=34.4\Omega$, $R_{DP}=56.6\Omega$.

Figure 6A:
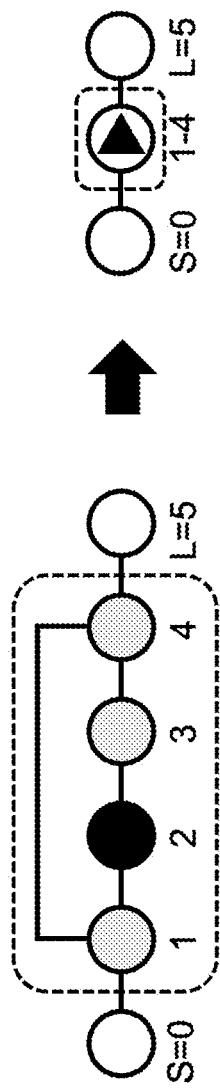
FIG. 6A is the coupled-resonator diagram (CRD) of the circuit of FIG. 3A.

FIG. 6A is a diagram of the CRD of the circuit in FIG. 3A. It comprises one resonating node (2), three non-resonant nodes (NRNs) (1,3,4), and four coupling elements (i.e., admittance inverters). In particular, two paths from the source to the load are considered: i) a direct coupling from nodes 1 and 4 representing the TL-based path in FIG. 3A and ii) another path with the resonating node and the NRNs. In this path, one non-reciprocal coupling element ($M_{23}$, $M_{32}$) is introduced between resonators 2 and 3 to represent the transistor behavior that results in a non-reciprocal transfer function in the resonant stage shaped by one pole—i.e., first order BPF—in the forward direction and one TZ in the reversed one. S-parameters were calculated based on the coupling matrix, the node admittances, and the resonating nodes in FIG. 6A.

TABLE 1

Coupling Element Values for the embodiment of FIG. 6A

| Example | With Gain | Without Gain |
|---|---|---|
| $M_{01} = M_{45}$ | 1 | 1 |
| $M_{12} = M_{34}$ | 1 | 1 |
| $M_{23}'$ | 0.0033 − j0.0392 | 0.0033 − j0.0391 |
| $M_{32}'$ | 3.0235 − j1.5943 | 2.16 − j1.08 |
| $M_{14}$ | 1.96 | 1.7495 |
| $R_{11}$ | −j0.1613 | −j0.2898 |
| $R_{22}'$ | 1.1271 − j0.295 | 1.075 − j0.165 |
| $R_{33}'$ | 1.3731 − j0.2658 | 1.365 − j0.345 |
| $R_{44}$ | −j0.1613 | −j0.2898 |

Figure 6B:
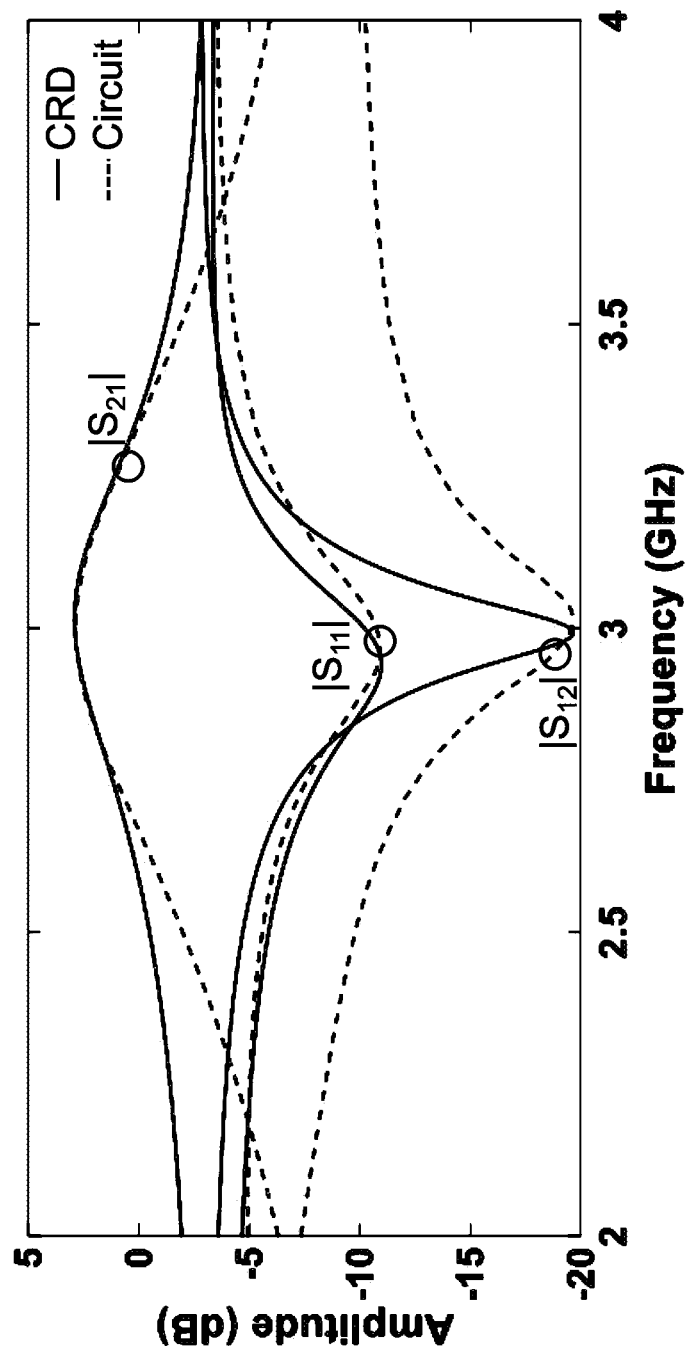
FIG. 6B is a plot showing synthesized (based on the coupling coefficients in FIG. 6A) and circuit-simulated (based on the circuit schematic in FIG. 3A) power transmission, isolation, and reflection responses.

FIG. 6B is a plot showing synthesized and circuit-simulated power transmission, isolation, and reflection responses using the coupling element values in FIG. 6A. Solid lines indicate the synthesized response and dotted lines indicate the circuit-simulated response of the circuit schematic in FIG. 3A. S-parameters for the CRD response were calculated based on the coupling matrix, the node admittances, and the resonating nodes that are listed in FIG. 6A. As shown, the synthesized response matches well with the simulated response at the specified operating frequency, thus validating the CRD at the desired frequency.

Figure 7A:
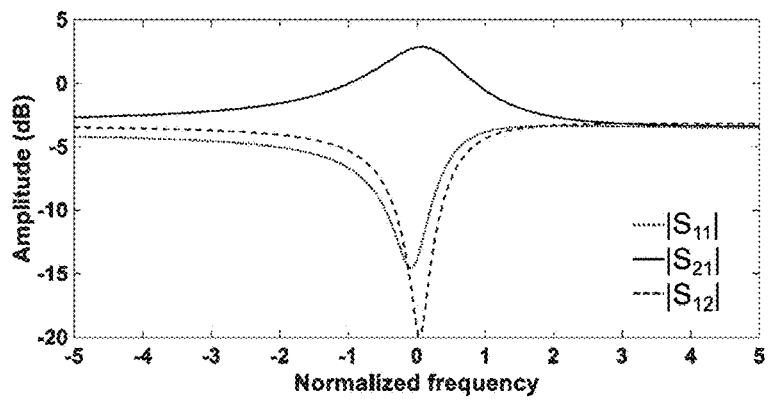
FIG. 7A is a plot illustrating normalized power transmission, isolation, and reflection responses for a first example based on the CRD of FIG. 6A that is designed to create gain in the forward direction using the coupling coefficients in Table 1.
Figure 7B:
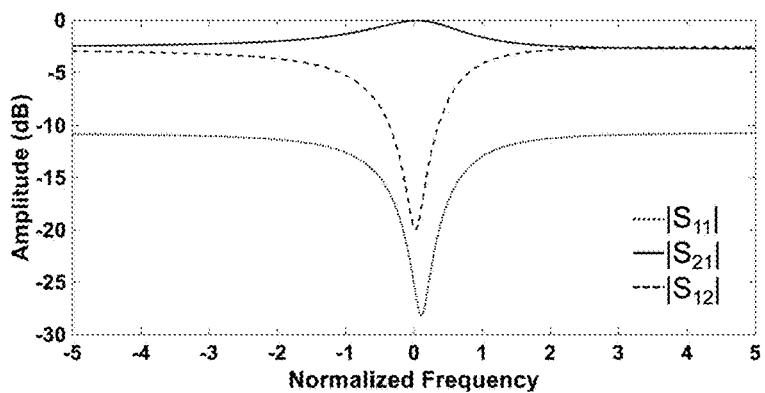
FIG. 7B is a plot illustrating normalized power transmission, isolation, and reflection responses for a second example based on the CRD and coupling coefficients of Table 1 that is designed without gain in the forward direction.

FIG. 7A is a plot illustrating normalized power transmission ($|S_{21}|$), isolation ($|S_{12}|$), and reflection responses ($|S_{11}|$), for a first example based on the CRD of FIG. 6A. FIG. 7B is a plot illustrating normalized power transmission, isolation, and reflection responses for a second example based on the CRD of FIG. 6A.

While the circuit in this stage in FIG. 7A was designed for enhanced power transmission, it can also be designed for zero loss and without gain by altering the bias point of the transistor and its corresponding CRD element values. This is demonstrated in FIG. 7B. In this case, the transistor needs to be biased at a lower power point ($V_{DD}$=2 V, $I_{DD}$=10 mA) and the resistor values are selected as follows: $R_{GS}$=43.1Ω, $R_{GP}$=45.2Ω, $R_{DS}$=37.4Ω, and $R_{DP}$=56.5Ω.

Figure 8A:
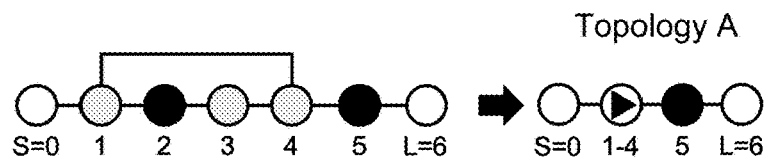
FIG. 8A is the CRD of an embodiment of the present invention that is designed to exhibit increased selectivity (in relation to the CRD of the non-reciprocal resonant stage in FIG. 6A) in the forward direction.
Figure 8B:
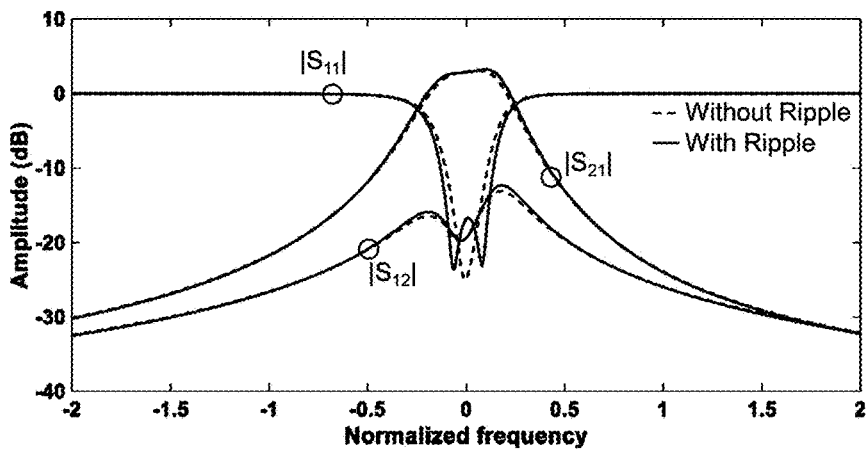
FIG. 8B is a plot showing synthesized and power transmission, isolation, and reflection responses of the embodiment of FIG. 8A using the coupling coefficients in Table 2 that results in Butterworth-type and equi-ripple type transfer functions.

FIG. 8A is a diagram illustrating the CRD of an embodiment of the present invention (designated Topology A), a two-pole configuration that incorporates a single non-reciprocal resonant stage and a reciprocal passive resonator. It comprises two resonating nodes—nodes 2 and 5—and three NRNs—nodes 1, 3, and 4. FIG. 8B is a plot showing synthesized and circuit-simulated power transmission, isolation, and reflection responses of the embodiment of FIG. 8A using the coupling element values in Table 2. Since it includes a single non-reciprocal resonant stage, it provides comparable gain and isolation to that of the single non-reciprocal resonant stage. However, it exhibits higher selectivity in its power transmission response.

TABLE 2

Coupling Element Values for the embodiment of FIG. 8A

| Transfer Function | Without ripple | With ripple |
|---|---|---|
| $M_{01}$ | 0.5 | 0.5 |
| $M_{12} = M_{34}$ | 1 | 1 |
| $M_{23}$ | 0.0033 − j0.0392 | 0.0033 − j0.0392 |
| $M_{32}$ | 3.0235 − j1.5943 | 3.0235 − j1.5943 |
| $M_{14}$ | 1.96 | 1.96 |
| $M_{45}$ | 0.25 | 0.27 |
| $M_{56}$ | 0.4 | 0.365 |
| $M_{22}$ | −0.05 | −0.05 |
| $R_{11} = R_{44}$ | −j0.1613 | −j0.1613 |
| $R_{22}$ | 1.1271 − j0.295 | 1.1271 − j0.295 |
| $R_{33}$ | 1.3731 − j0.2658 | 1.3731 − j0.2658 |

Figure 9A:
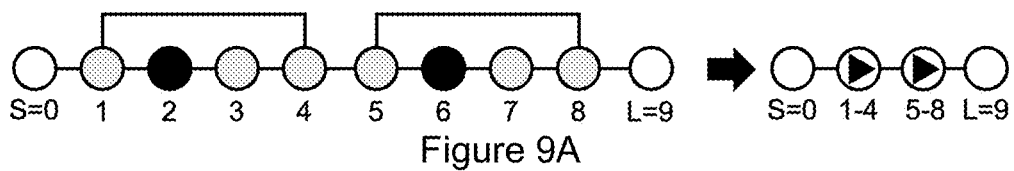
FIG. 9A is the CRD response of another embodiment of the present invention that is designed to exhibit increased selectivity (in relation to the CRD of the non-reciprocal resonant stage in FIG. 6A) in the forward direction and increased isolation (in relation to the CRD of the nonreciprocal resonant stage in FIG. 6A) in the reverse direction.
Figure 9B:
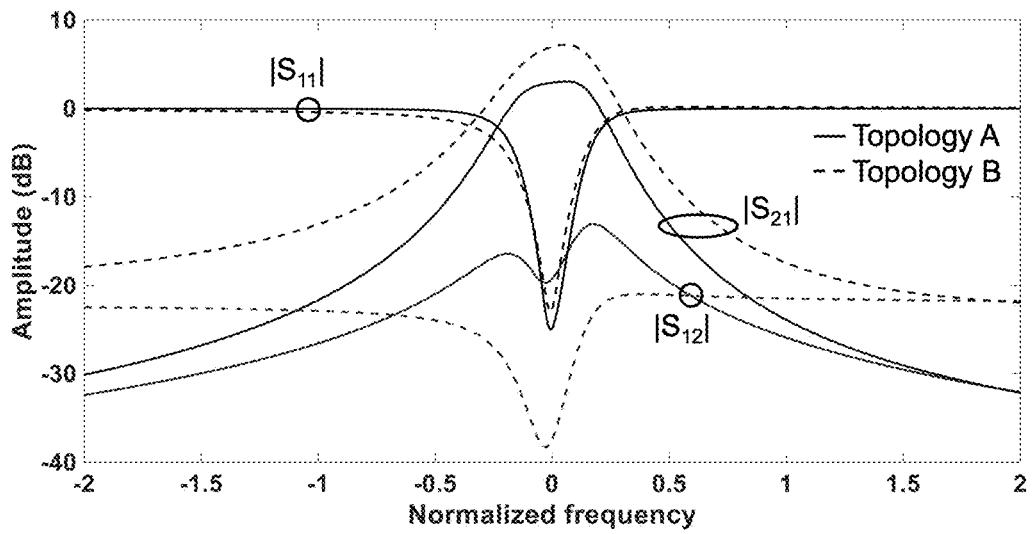
FIG. 9B is a plot showing its responses using the coupling coefficients in Table 3.

FIG. 9A is a diagram illustrating the CRD of another embodiment of the present invention (Topology B). FIG. 9B is a plot showing its responses using the coupling element values in Table 3. Isolation and power transmission were increased while obtaining a two-pole selectivity in the power transmission response by cascading in series two non-reciprocal resonant stages as shown in the CRD of FIG. 9A. It comprises two resonating nodes—nodes 2 and 6—and six NRNs. A comparison between Topology A (CRD in FIGS. 8A, solid trace) and B (CRD in FIG. 9A) dashed trace) are provided in FIG. 9B, demonstrating the varying levels of gain and isolation between the two architectures. This difference is to be expected due to the use of two non-reciprocal resonant stages versus one in Topology A CRD.

TABLE 3

Coupling Element Values for the embodiment of FIG. 9A

| $M_{01} = M_{89}$ | 1 |
|---|---|
| $M_{12} = M_{34} = M_{56} = M_{78}$ | 1 |
| $M_{23} = M_{67}$ | 0.0033 − j0.0392 |
| $M_{32} = M_{76}$ | 3.0235 − j1.5943 |
| $M_{14} = M_{58}$ | 1.96 |
| $M_{22} = M_{66}$ | −0.05 |
| $R_{11} = R_{44} = R_5 = R_{88}$ | −j0.1613 |
| $R_{22} = R_{66}$ | 1.1271 − j0.295 |
| $R_{33} = R_{77}$ | 1.3731 − j0.2658 |

Figure 10A:
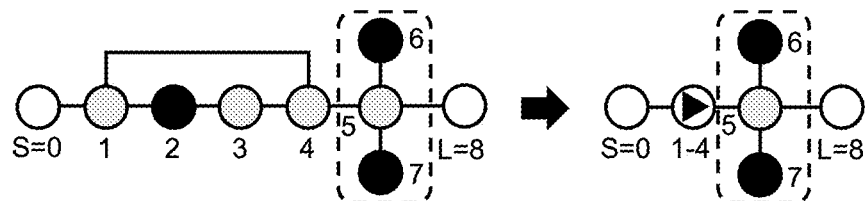
FIG. 10A is the CRD of another embodiment of the present invention that is designed to exhibit increased selectivity and transmission zeros (in relation to the CRD of the non-reciprocal resonant stage in FIG. 6A) in the forward direction.
Figure 10B:
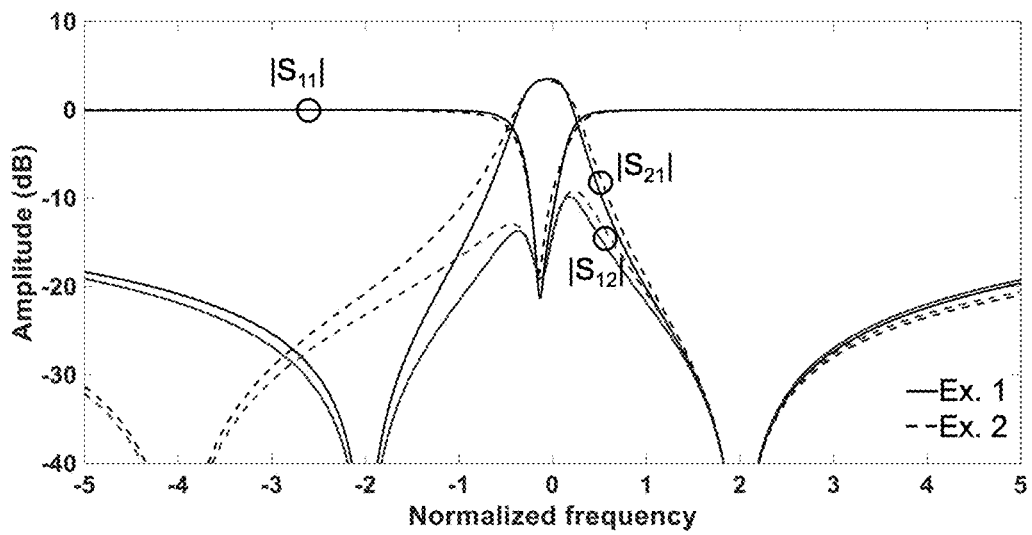
FIG. 10B is a plot showing its responses using the coupling coefficients in Table 4.

FIG. 10A is a diagram illustrating the CRD response of another embodiment of the present invention (Topology C). FIG. 10B is a plot showing its responses using the coupling element values in Table 4. The non-reciprocal stage was combined with a reciprocal multi-resonant cell in order to increase the out-of-band of the power transmission response by adding TZs. In this case, the passive resonator in Topology A is replaced by a multi-resonant cell—shaped by one NRN and two resonating nodes—that contributes to the overall power transmission response to one pole and two TZs. As such, the overall Topology C CRD is shaped by three resonating nodes—nodes 2, 6, and 7—and four NRNs—nodes 1, and 3-5. Note that the multi-resonant cell can enable both asymmetric and symmetric placement of TZs above and below the passband, as shown in the synthesized responses. While this topology results in better out-of-band suppression in a close proximity to the passband, the gain and isolation are comparable to the ones obtained in the Topology A (in FIG. 8) BPFI. The BPFI concept can be extended to the realization of even higher order CRDs with the purpose of achieving: i) power transmission responses in the forward direction with higher levels of selectivity, gain and out-of-band suppression, and ii) reverse transmission with high and wide levels of isolation. This is shown in the following figures.

TABLE 4

Coupling Element Values for the embodiment of FIG. 10A

| Example | 1 | 2 |
|---|---|---|
| $M_{01} = M_{58}$ | 0.625 | 0.625 |
| $M_{12} = M_{34}$ | 1 | 1 |
| $M_{23}$ | 0.0033 − j0.0392 | 0.0033 − j0.0392 |
| $M_{32}$ | 3.0235 − j1.5943 | 3.0235 − j1.5943 |
| $M_{14}$ | 1.96 | 1.96 |
| $M_{45}$ | 0.416 | 0.416 |
| $M_{56}$ | 1.7 | 1.7 |
| $M_{57}$ | 1.65 | 2.4 |
| $M_{22}$ | −0.15 | −0.15 |
| $M_{66}$ | 2 | 2 |
| $M_{77}$ | −2 | −4 |
| $R_{11} = R_{44}$ | −j0.1613 | −j0.1613 |
| $R_{22}$ | 1.1271 − j0.295 | 1.1271 − j0.295 |
| $R_{33}$ | 1.3731 − j0.2658 | 1.3731 − j0.2658 |

Figure 11A:
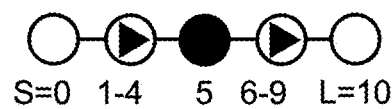
FIG. 11A is the CRD of another embodiment of the present invention that is designed to exhibit increased selectivity (in relation to the CRD of the non-reciprocal resonant stage in FIG. 6A) in the forward direction and increased isolation in the reverse direction (in relation to the CRD of the non-reciprocal resonant stage in FIG. 6A).
Figure 11B:
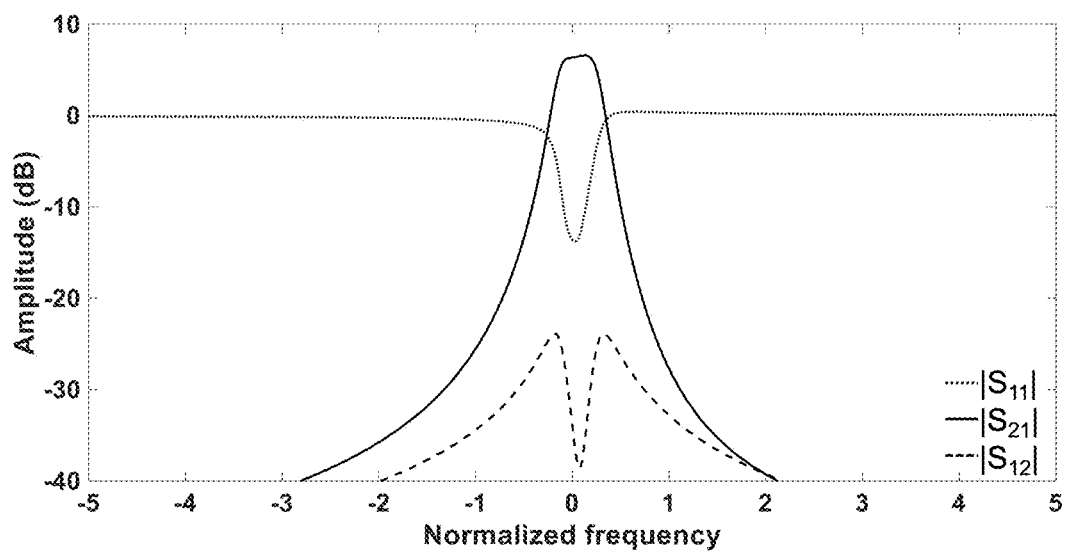
FIG. 11B is a plot showing its responses using the coupling coefficients in Table 5.

FIG. 11A is a diagram illustrating the CRD of another embodiment of the present invention, Topology D. FIG. 11B is a plot showing its responses using the coupling element values in Table 5. It comprises two non-reciprocal resonant stages and one passive microwave resonator that are cascaded in series through impedance inverters. Thus, this architecture comprises three resonant nodes—nodes 2 and 5, and 7—and six NRNs—nodes 1, 3-4, 6, and 8-9, which result in a power transmission response that is shaped by three poles.

TABLE 5

Coupling Element Values for the embodiment of FIG. 11A

| $M_{01} = M_{910}$ | 0.85 |
|---|---|
| $M_{12} = M_{34} = M_{67} = M_{89}$ | 1 |
| $M_{23} = M_{78}$ | 0.0033 − j0.0392 |
| $M_{32} = M_{87}$ | 3.0235 − j1.5943 |
| $M_{14} = M_{69}$ | 1.96 |
| $M_{45} = M_{56}$ | 0.25 |
| $M_{22} = M_{77}$ | 0.05 |
| $R_{11} = R_{44} = R_{66} = R_{99}$ | −j0.1613 |
| $R_{22} = R_{77}$ | 1.1271 − j0.295 |
| $R_{33} = R_{88}$ | 1.3731 − j0.2658 |

Figure 12A:
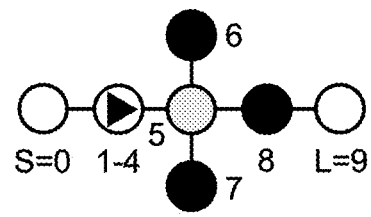
FIG. 12A is the CRD of another embodiment of the present invention that is designed to exhibit increased selectivity and transmission zeros (in relation to the CRD of the non-reciprocal resonant stage in FIG. 6A) in the forward direction.
Figure 12B:
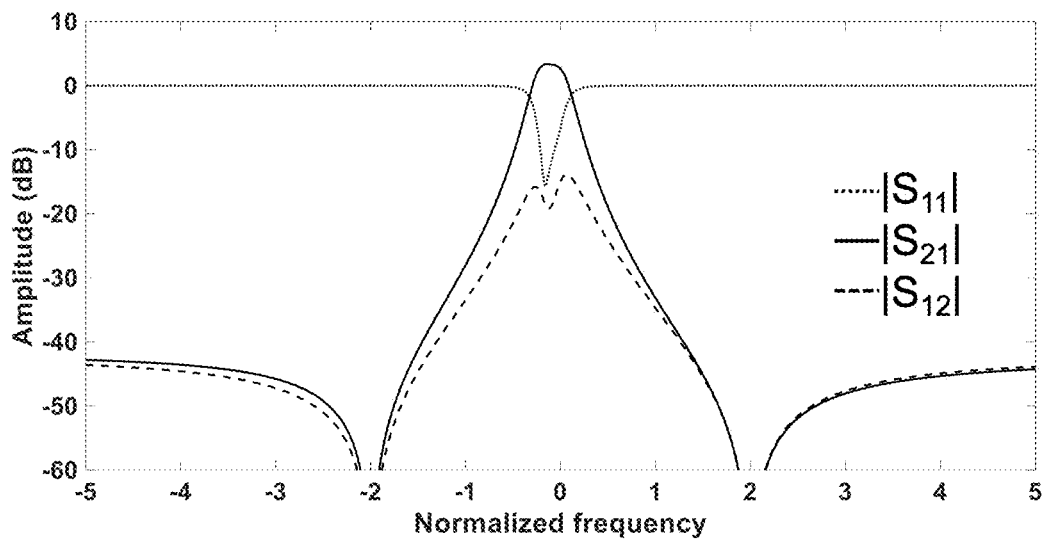
FIG. 12B is a plot showing its responses using the coupling coefficients in Table 6.

FIG. 12A is a diagram illustrating the CRD of another embodiment of the present invention, Topology E. FIG. 12B is a plot showing its responses using the coupling element values in Table 6. This BPFI has three poles and two TZs in the forward direction and was realized by cascading in series a non-reciprocal resonant stage, a passive resonator, and a TZ generation cell. The multi-resonant cell can enable symmetric or asymmetric power transmission responses in the forward direction, by altering the couplings element values in a similar fashion to the ones in Topology C (in FIG. 10). When compared to the power transmission and isolation response of the Topology C BPFI, its gain and isolation are equal, however, the selectivity is increased by adding an additional pole in the passband.

TABLE 6

Coupling Element Values for the embodiment of FIG. 12A

| Example | 1 | 2 |
|---|---|---|
| $M_{01} = M_{89}$ | 0.85 | 0.85 |
| $M_{12} = M_{34}$ | 1 | 1 |
| $M_{23}$ | 0.0033 − j0.0392 | 0.0033 − j0.0392 |
| $M_{32}$ | 3.0235 − j1.5943 | 3.0235 − j1.5943 |
| $M_{14}$ | 1.96 | 1.96 |
| $M_{45} = M_{58}$ | 0.25 | 0.25 |
| $M_{56}$ | 1.55 | 2.2 |
| $M_{57}$ | 1.65 | 1.65 |
| $M_{22}$ | −0.15 | −0.15 |
| $M_{66}$ | 2 | 2 |
| $M_{77}$ | −2 | −4 |
| $R_{11} = R_{44}$ | −j0.1613 | −j0.1613 |
| $R_{22}$ | 1.1271 − j0.295 | 1.1271 − j0.295 |
| $R_{33}$ | 1.3731 − j0.2658 | 1.3731 − j0.2658 |

Figure 13A:
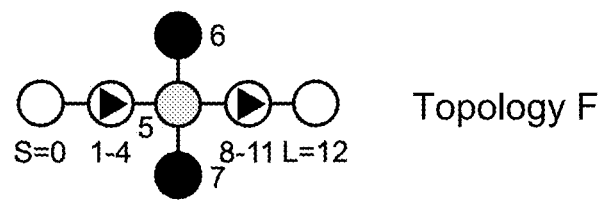
FIG. 13A is the CRD of another embodiment of the present invention that is designed to exhibit increased selectivity and transmission zeros (in relation to the CRD of the non-reciprocal resonant stage in FIG. 6A) in the forward direction and increased isolation in the reverse direction (in relation to the CRD of the non-reciprocal resonant stage in FIG. 6A).
Figure 13B:
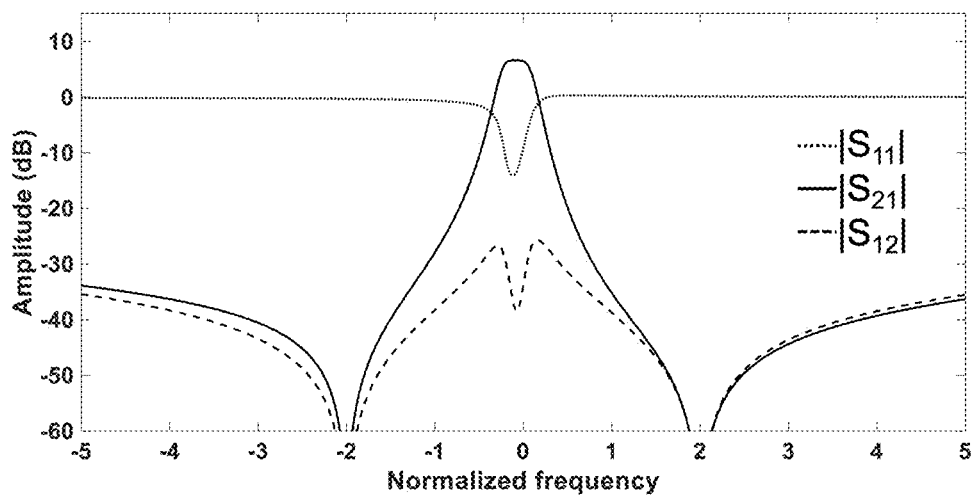
FIG. 13B is a plot showing its responses using the coupling coefficients in Table 7.

FIG. 13A is a diagram illustrating the CRD of another embodiment (Topology F) of the present invention. FIG. 13B is a plot showing its responses using the coupling element values in Table 7. Gain and isolation were increased by increasing the number of non-reciprocal resonant stages in the CRD. By exchanging the reciprocal resonator in Topology E to a non-reciprocal resonant stage, the power transmission response in the forward direction is shaped by three poles and two TZs. The multi-resonant cell is represented by a NRN and two resonating nodes (nodes 5-7).

TABLE 7

Coupling Element Values for the embodiment of FIG. 13A

| $M_{01} = M_{1112}$ | 0.85 |
|---|---|
| $M_{12} = M_{34} = M_{89} = M_{1011}$ | 1 |
| $M_{23} = M_{910}$ | 0.0033 − j0.0392 |
| $M_{32} = M_{109}$ | 3.0235 − j1.5943 |
| $M_{14} = M_{811}$ | 1.96 |
| $M_{45} = M_{58}$ | 0.25 |
| $M_{56}$ | 1.55 |
| $M_{57}$ | 1.65 |
| $M_{22} = M_{99}$ | −0.1 |
| $M_{66}$ | 2 |
| $M_{77}$ | −2 |
| $R_{11} = R_{44}$ | −j0.1613 |
| $R_{22}$ | 1.1271 − j0.295 |
| $R_{33}$ | 1.3731 − j0.2658 |

Figure 14A:
FIG. 14A is the CRD of another embodiment of the present invention that is designed to exhibit increased selectivity (in relation to the CRD of the non-reciprocal resonant stage in FIG. 6A) in the forward direction and increased isolation in the reverse direction (in relation to the CRD of the non-reciprocal resonant stage in FIG. 6A).
Figure 14B:
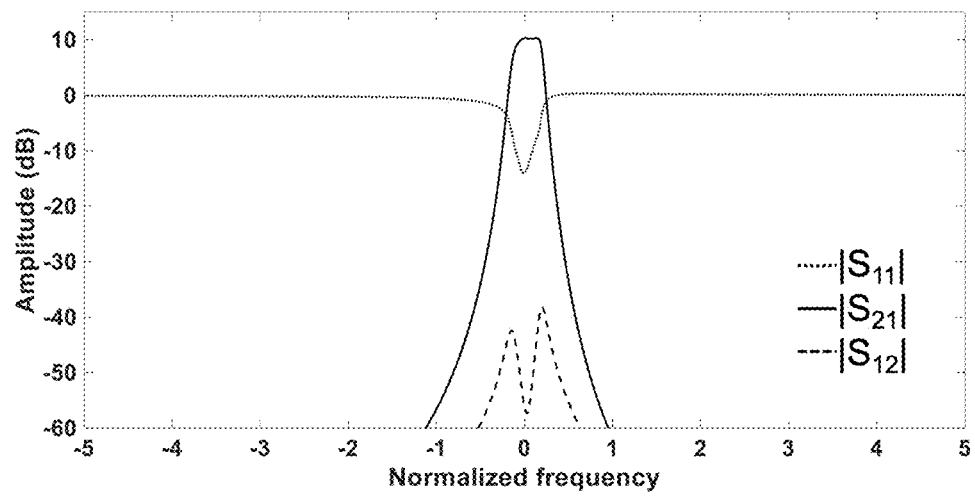
FIG. 14B is a plot showing its responses using the coupling coefficients in Table 8.

FIG. 14A is a diagram illustrating the CRD response of another embodiment (Topology G) of the present invention. FIG. 14B is a plot showing its responses using the coupling element values in Table 8. Topology G is shaped by three non-reciprocal resonant stages and two microwave resonators. Through this implementation, gain, isolation, and frequency selectivity are increased when compared to previous topologies. This topology enables about three times the amount of gain and isolation that the single non-reciprocal resonant stage provides.

TABLE 8

Coupling Element Values for the embodiment of FIG. 14A

| $M_{01} = M_{1415}$ | 0.85 |
|---|---|
| $M_{12} = M_{34} = M_{67} = M_{89} = M_{1112} = M_{1314}$ | 1 |
| $M_{23} = M_{78} = M_{1213}$ | 0.0033 − j0.0392 |
| $M_{32} = M_{87} = M_{1312}$ | 3.0235 − j 1.5943 |
| $M_{14} = M_{69} = M_{1114}$ | 1.96 |
| $M_{45} = M_{56} = M_{910} = M_{1011}$ | 0.25 |

TABLE 8-continued

Coupling Element Values for the embodiment of FIG. 14A

| | |
|---|---|
| $R_{11} = R_{44} = R_{66} = R_{99} = R_{1111} = R_{1414}$ | $-j0.1613$ |
| $R_{22} = R_{55} = R_{1212}$ | $1.1271 - j0.295$ |
| $R_{33} = R_{88} = R_{1313}$ | $1.3731 - j0.2658$ |

Figure 15A:
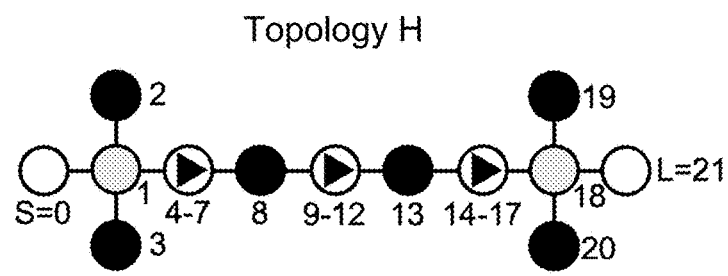
FIG. 15A is the CRD of another embodiment of the present invention that is designed to exhibit increased selectivity and transmission zeros (in relation to the CRD of the non-reciprocal resonant stage in FIG. 6A) in the forward direction and increased isolation in the reverse direction (in relation to the CRD of the non-reciprocal resonant stage in FIG. 6A).
Figure 15B:
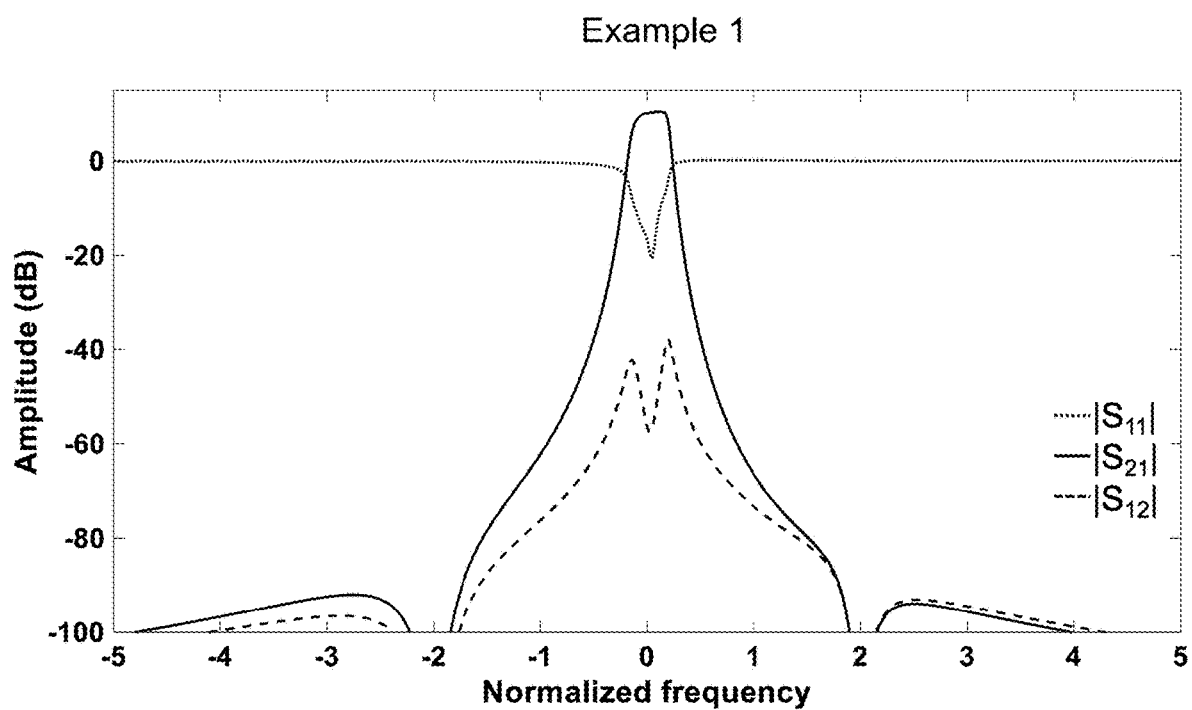
FIGS. 15B-D are plots showing its responses for the example cases of the coupling coefficients in Table 9.
Figure 15C:
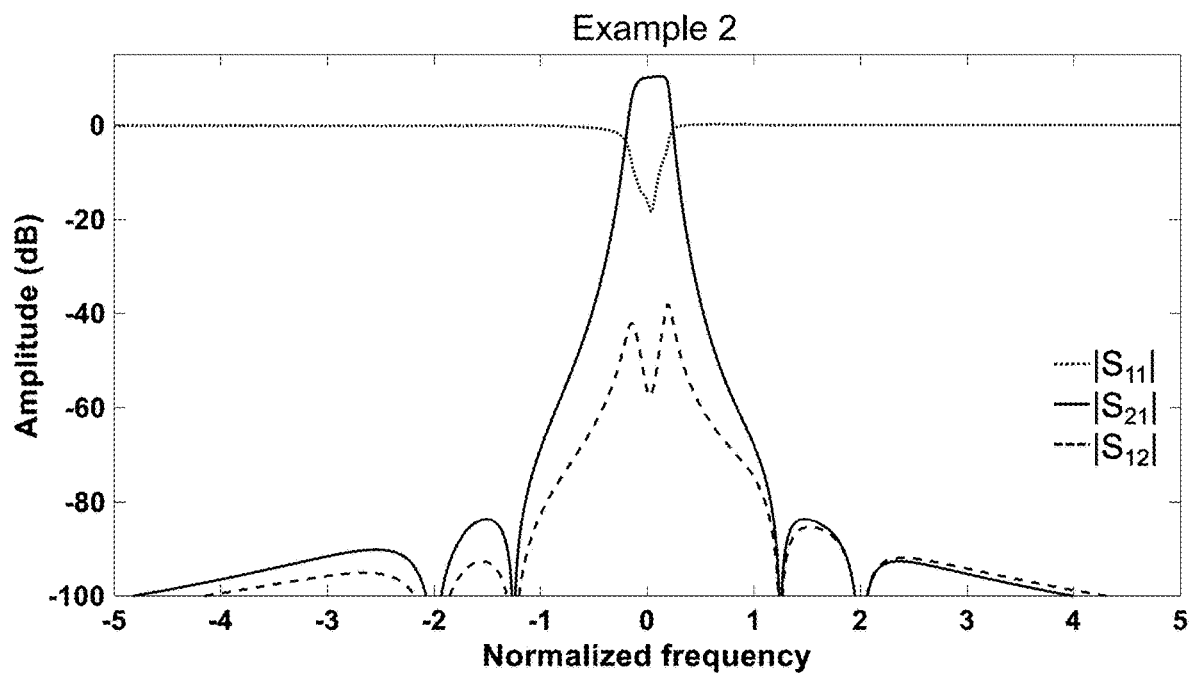
Figure 15D:
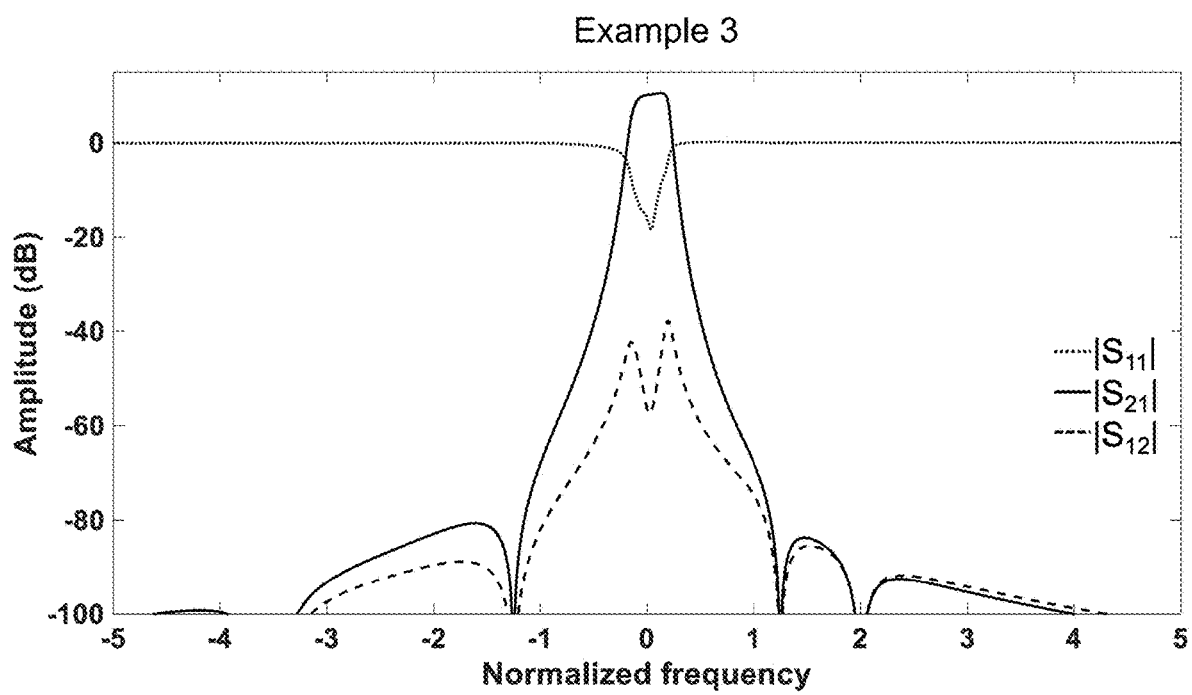

FIG. 15A is a diagram illustrating the CRD of another embodiment (Topology H) of the present invention. FIGS. 15B-D are plots showing its responses for three examples using the coupling element values in Table 9. This embodiment, is a seventh order BPFI shaped by seven poles and two multi-resonant cells and increases the selectivity and out-of-band suppression in the forward direction. The multi-resonant cells contribute to four TZs, which can be designed to provide a symmetric or asymmetric placement of TZs around the passband. In particular, Example 1 in FIG. 15B demonstrates multi-resonant cells that are identical, showing fours TZs that are merged at two frequencies. Examples 2 (FIG. 15C) and 3 (FIG. 15D) show four TZs where there is symmetric and asymmetric placement of TZs surrounding the passband.

TABLE 9

Coupling Element Values for the embodiment of FIG. 15A

| Example | 1 | 2 | 3 |
|---|---|---|---|
| $M_{01} = M_{1821}$ | 2 | 2 | 2 |
| $M_{12} = M_{1819}$ | 1.5 | 1.5 | 1.5 |
| $M_{13} = M_{1820}$ | 1 | 1 | 1 |
| $M_{14} = M_{1718}$ | 1.25 | 1.25 | 1.25 |
| $M_{45} = M_{67} = M_{910} = M_{1112} = M_{1415} = M_{1617}$ | 1 | 1 | 1 |
| $M_{56} = M_{1011} = M_{1516}$ | $0.0033 - j0.0392$ | $0.0033 - j0.0392$ | $0.0033 - j0.0392$ |
| $M_{65} = M_{1110} = M_{1615}$ | $3.0235 - j1.5943$ | $3.0235 - j1.5943$ | $3.0235 - j1.5943$ |
| $M_{47} = M_{912} = M_{1417}$ | 1.96 | 1.96 | 1.96 |
| $M_{78} = M_{89} = M_{1213} = M_{1314}$ | 0.21 | 0.21 | 0.21 |
| $M_{22}$ | $-2$ | $-2$ | $-3.5$ |
| $M_{33}$ | 2 | 2 | 2 |
| $M_{1919}$ | $-2$ | $-1.25$ | $-1.25$ |
| $M_{2020}$ | 2 | 1.25 | 1.25 |

Figure 16:
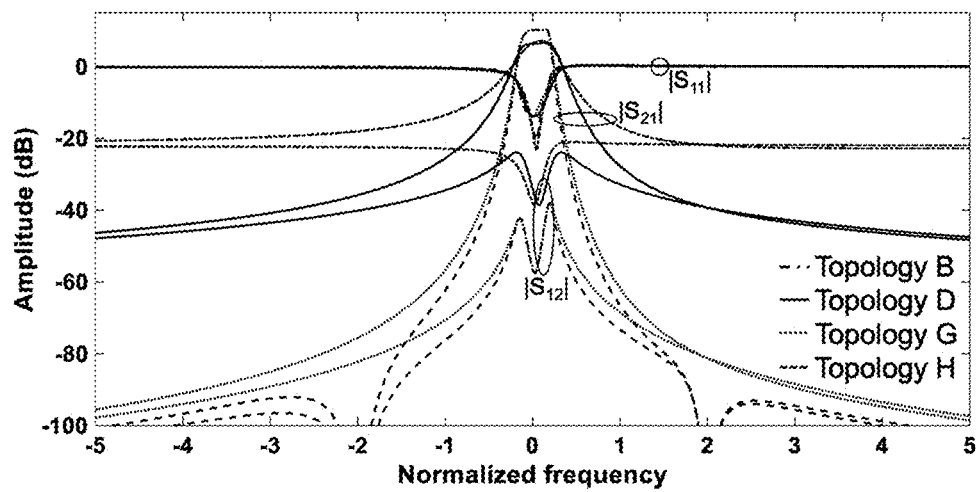
FIG. 16 is plot comparing the synthesized S-parameters of several of the above embodiments.

FIG. 16 is a plot comparing the synthesized S-parameters of several of the above embodiments. It provides a graphical and quantitative RF performance comparison between Topology B (FIG. 9), Topology D (FIG. 10), Topology G (FIG. 14), and Topology H (FIG. 15). Even though the order of the filter changes, gain and isolation are only affected by the number of the non-reciprocal stages in the BPFI. In addition, the frequency selectivity of each synthesized response changes as the order of the filter is increased, which is consistent with conventional coupled-resonator-based BPF designs using reciprocal resonators.

Figure 17A:
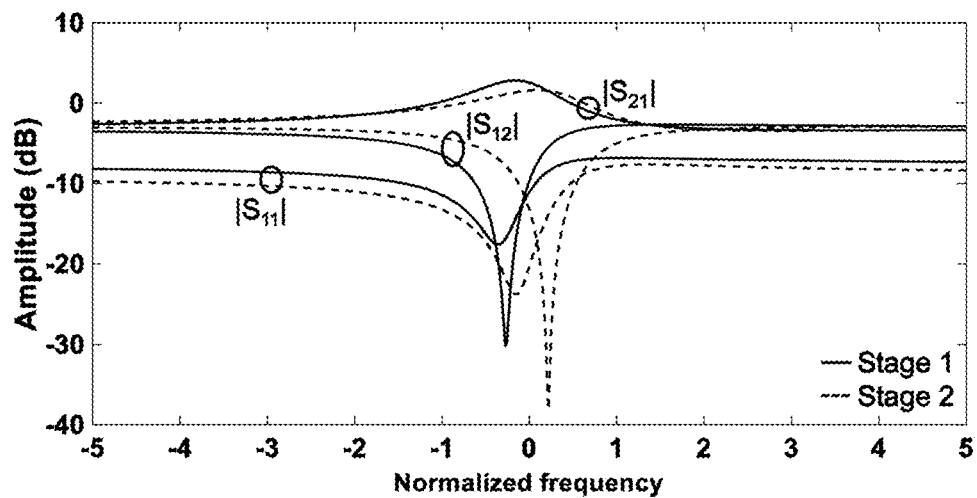
FIG. 17A is a plot showing synthesized S-parameters for the non-reciprocal stage produced by in FIG. 6A when designed for two different isolation minima in the reverse direction.
Figure 17B:
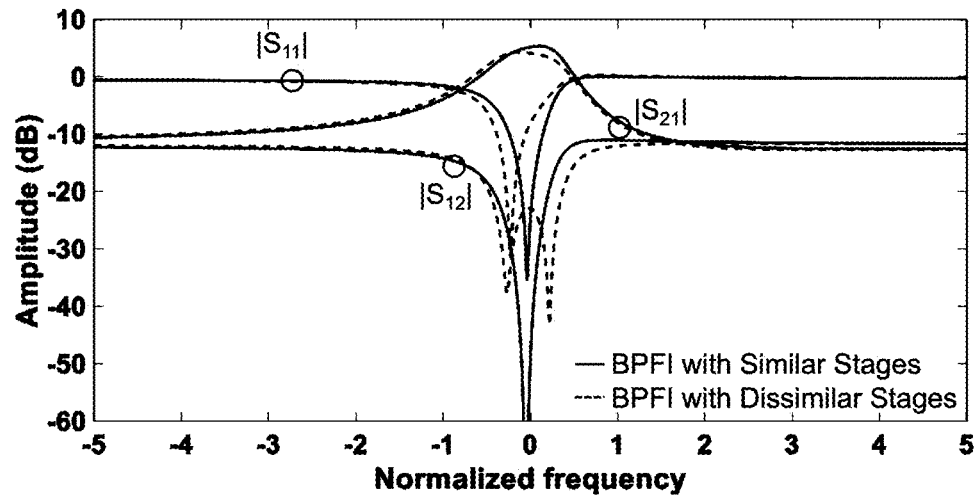
FIG. 17B is a plot showing synthesized S-parameters for a second order BPFI that comprises the non-reciprocal stages in FIG. 17A.

FIG. 17A is a plot showing synthesized S-parameters for two different types of non-reciprocal stages. FIG. 17B is a plot showing synthesized S-parameters for a second order BPFI using the non-reciprocal stages in FIG. 17A.

Another design characteristic of the BPFI is the isolation response in the reverse direction. While all of the synthesized isolation responses demonstrate a single isolation zero, multiple isolation zeros can be implemented by separating the frequencies of isolation zeros in each of the non-reciprocal resonant stages. This is shown in FIGS. 17A and 17B. By altering the biasing of the transistor and changing the overall phase of the TL-based path, the isolation minimum is shifted in frequency as shown in FIG. 17A. When cascading two of these non-reciprocal stages, a two-pole power transmission response can be obtained in the forward direction and an isolation response with two isolation zeros in the reversed one as shown in FIG. 17B. While the design with a single resonance has a larger isolation level at the center frequency of the BPFI, the separate isolation resonances exhibit a larger isolation BW.

In order to experimentally validate the non-reciprocal filtering concept, five BPFI prototypes were designed, manufactured, and characterized using a hybrid integration scheme in which microstrip-type resonators and inverters are combined with non-reciprocal stages shaped by hybrid lumped element/microstrip lines. They include: 1) a two-pole BPFI based on the CRD of Topology B (in FIG. 9); 2) a three-pole BPFI based on the CRD of Topology D (in FIG. 10); 3) a three-pole/two-TZ BPFI based on the CRD of Topology F (in FIG. 13); 4) a five-pole BPFI based on the CRD of Topology G (in FIG. 14); and 5) a seven-pole/four-TZ BPFI based on Topology H (in FIG. 15).

In all of the BPFI designs, the impedance inverters are implemented using quarter-wavelength-long TL segments at the operating frequency. The non-reciprocal stages are implemented using lumped element and microstrip based components. The reciprocal resonators are implemented through shorted quarter wavelength long TLs, and the multi-resonant cells are implemented using open quarter-wavelength long TLs.

Figure 18A:
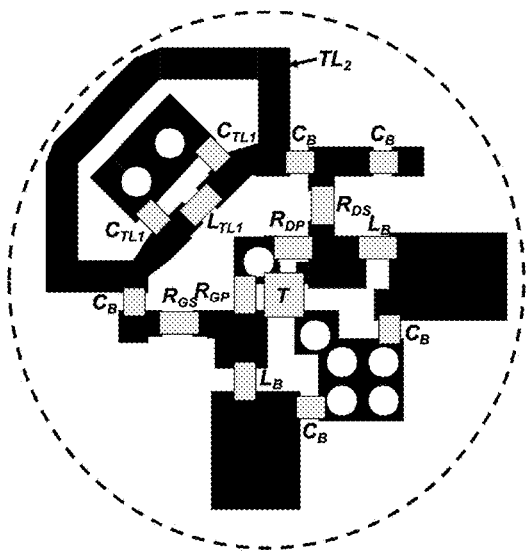
FIG. 18A is a schematic diagram of the layout of a prototype non-reciprocal resonant stage.
Figure 18B:
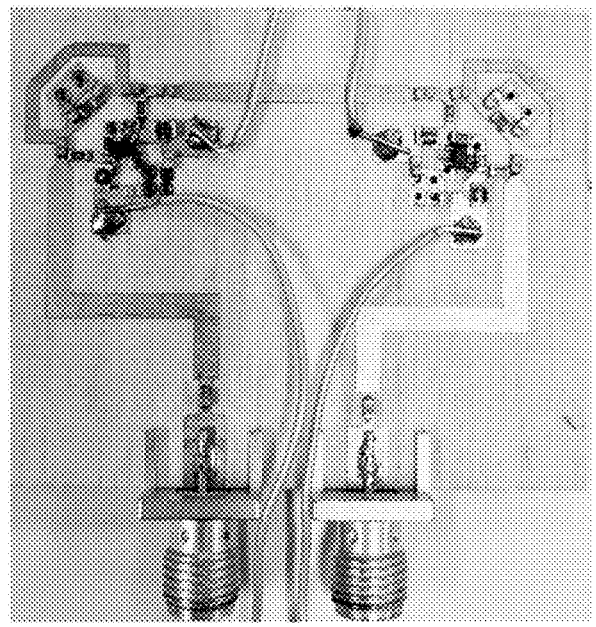
FIG. 18B is a photo of a BPFI prototype.
Figure 18C:
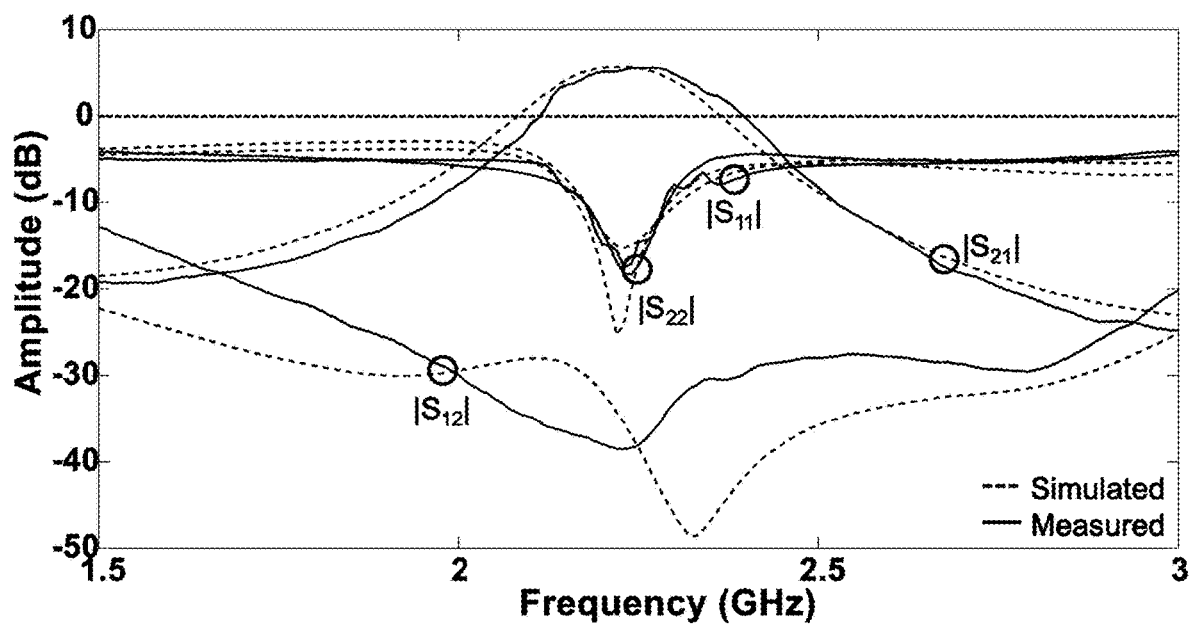
FIG. 18C is a plot showing measured and simulated S-parameters of this prototype.

FIG. 18A is a schematic diagram of the layout of a prototype non-reciprocal resonant stage. FIG. 18B is a photo of a second order BPFI prototype. FIG. 18C is a plot showing measured and simulated S-parameters of this prototype. In order to validate the Topology B two-pole BPFI that is based on the CRD in FIG. 9 a microstrip- and LE-based prototype was designed for a center frequency of 2.2 GHz and FBW of 9.3% using the CRD in FIG. 9. It was manufactured using RO4350B substrate with the following characteristics: relative dielectric permittivity $\varepsilon_r = 3.48$, tan $\delta_D = 0.003$, $H=1.52$ mm, and 1 oz. copper cladding.

Due to the need for low characteristic impedance in the TL of the non-reciprocal stage, the line was split into two parallel TLs, one implemented through microstrip TL and the other with LE-based TL (low-pass first-order circuit equivalent) for size compactness. The comparison between the simulated and measured results show good agreement, thus validating the proposed concept. The RF performance of the prototype is summarized as follows: center frequency ($f_{cen}$)=2.2 GHz, FBW=9.3%, power transmission response at $f_{cen}$ (|S21|)=5.6 dB, $f_{cen}$ IS=43.7 dB, maximum in-band IS=44 dB, and minimum 1-dB BW IS=37.8 dB.

Figure 19A:
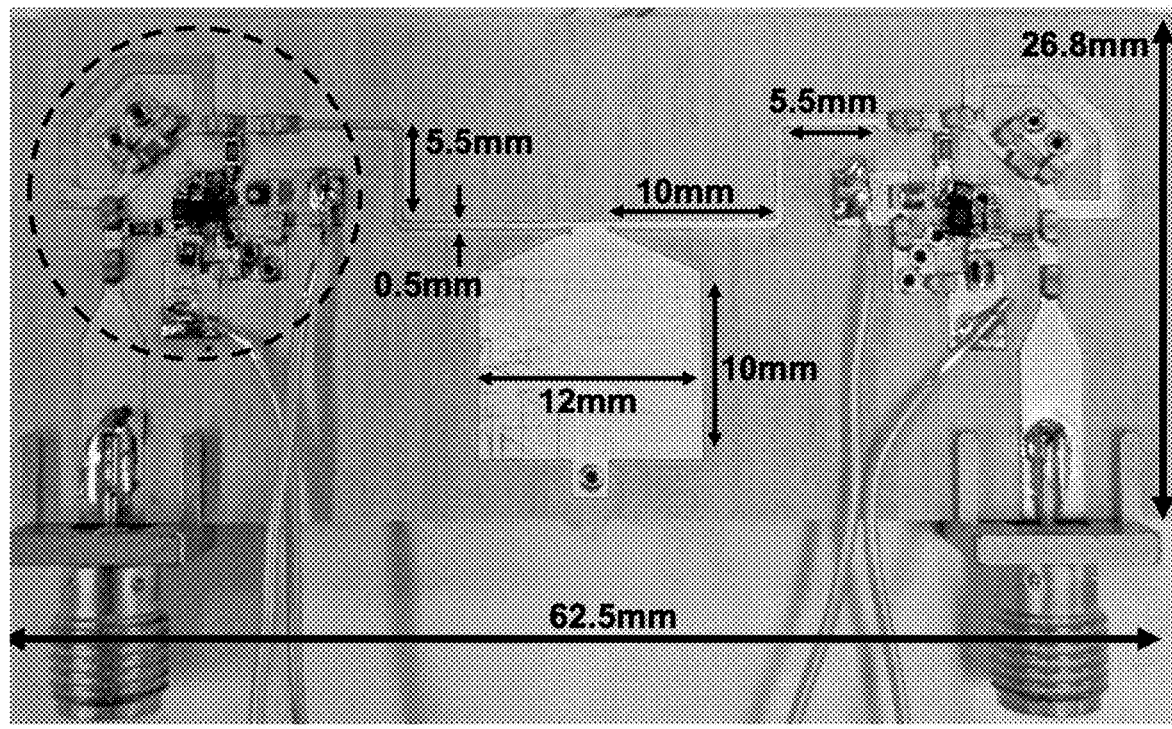
FIG. 19A is a photo of another prototype BPFI.
Figure 19B:
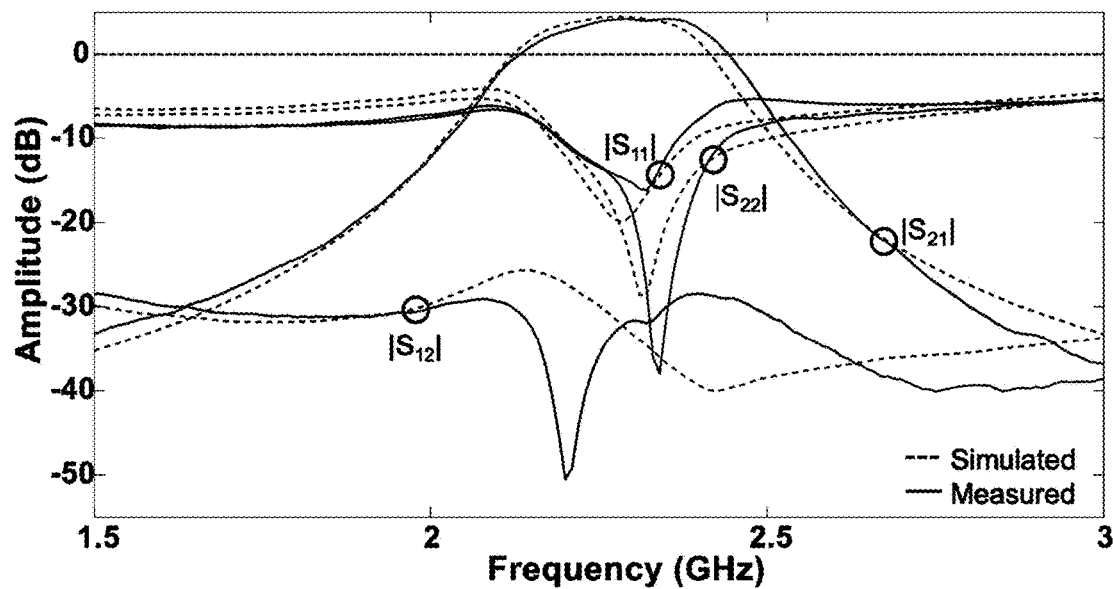
FIG. 19B is a plot showing measured and simulated S-parameters of this prototype.

FIG. 19A is a photo of another prototype BPFI. FIG. 19B is a plot showing measured and simulated S-parameters of this prototype. This third order BPFI was designed and measured to validate Topology D in FIG. 11. It is based on the CRD in FIG. 11, where two non-reciprocal resonators are cascaded in series with a passive resonator. The passive resonator is made up of a shorted, quarter-wavelength long transmission line and the inverters are realized with quarter-wavelength long transmission lines. The prototype was designed on a RO4350B substrate to operate at 2.3 GHz with FBW of 11%. The RF measured and EM-simulated results show good agreement. The RF performance is summarized as follows: $f_{cen}$=2.3 GHz, FBW=12.2%, maximum gain (|S21|)=4.2 dB, $f_{cen}$ IS=36.0, maximum in-band IS=46.4 dB, minimum 1-dB BW IS=31.6 dB.

Figure 20A:
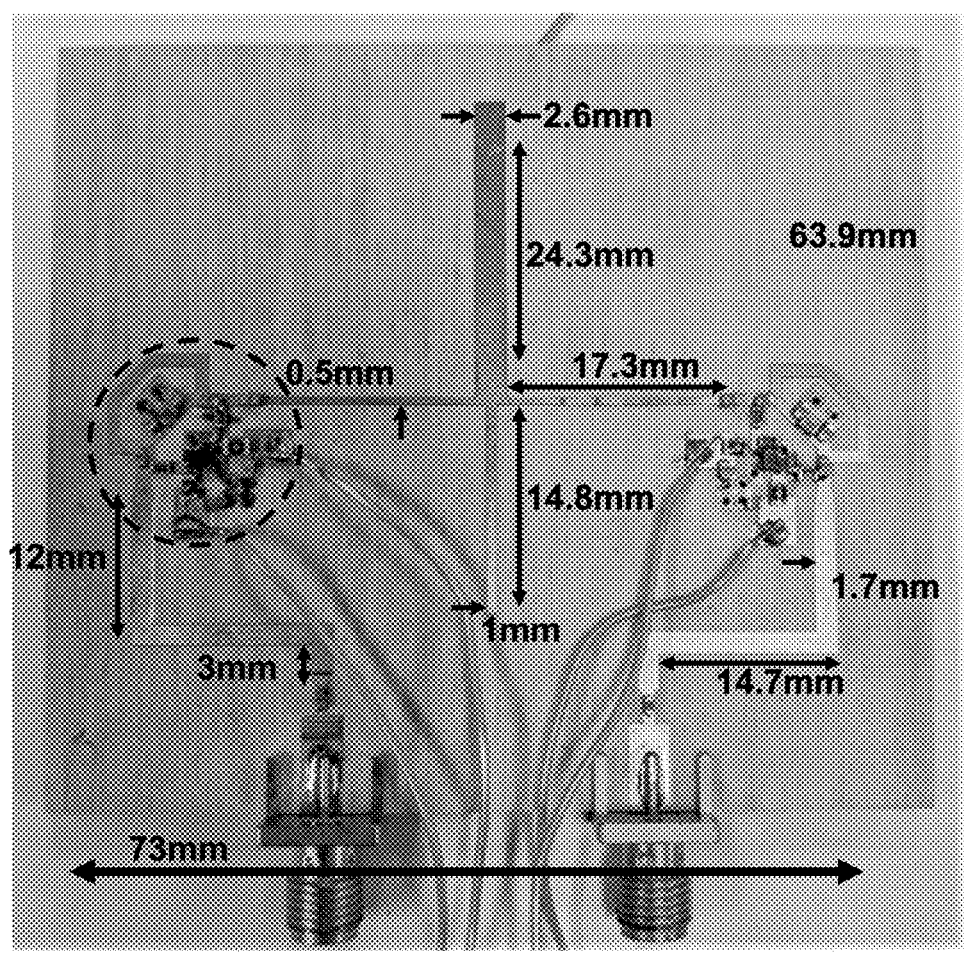
FIG. 20A is a photo of another prototype BPFI.
Figure 20B:
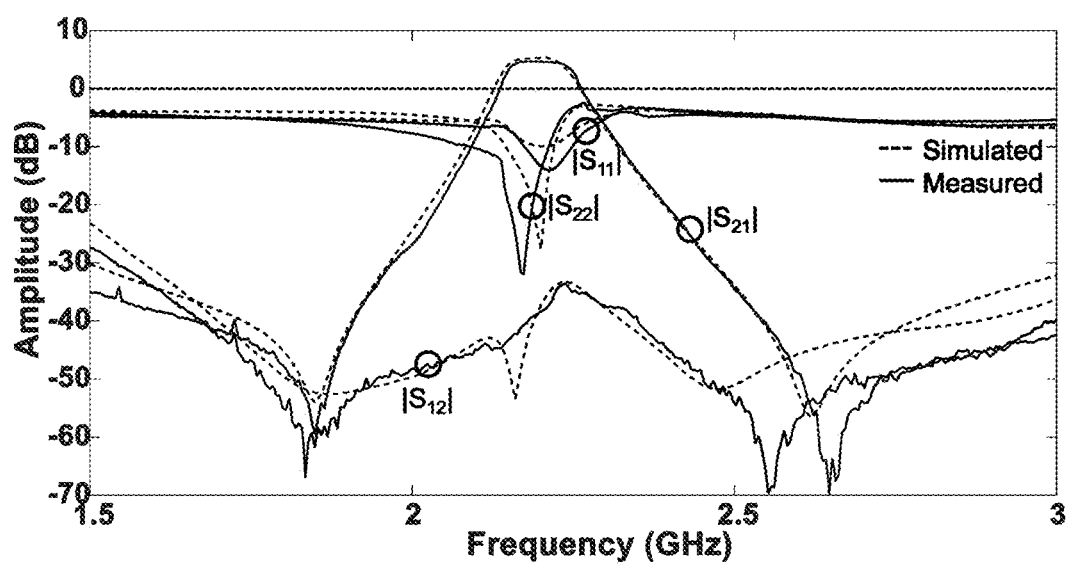
FIG. 20B is a plot showing measured and simulated S-parameters of this prototype.

FIG. 20A is a photo of another prototype BPFI. FIG. 20B is a plot showing measured and simulated S-parameters of this prototype. This third order BPFI with two TZs in its power transmission response was designed, built, and measured to experimentally validate Topology F CRD in FIG. 13. The inverters and the multi-resonant cell are made up of quarter-wavelength long TLs. It was designed for a center frequency of 2.2 GHz with FBW of 4.8%. The TZs were designed to resonate at 1.85 and 2.65 GHz, respectively. The RF performance is summarized as follows: $f_{cen}$=2.2 GHz, FBW=5.2%, maximum gain=4.7 dB, $f_{cen}$ IS=43.9 dB, maximum in-band IS=46.7 dB, and minimum 1-dB BW IS=37.9 dB.

Figure 21A:
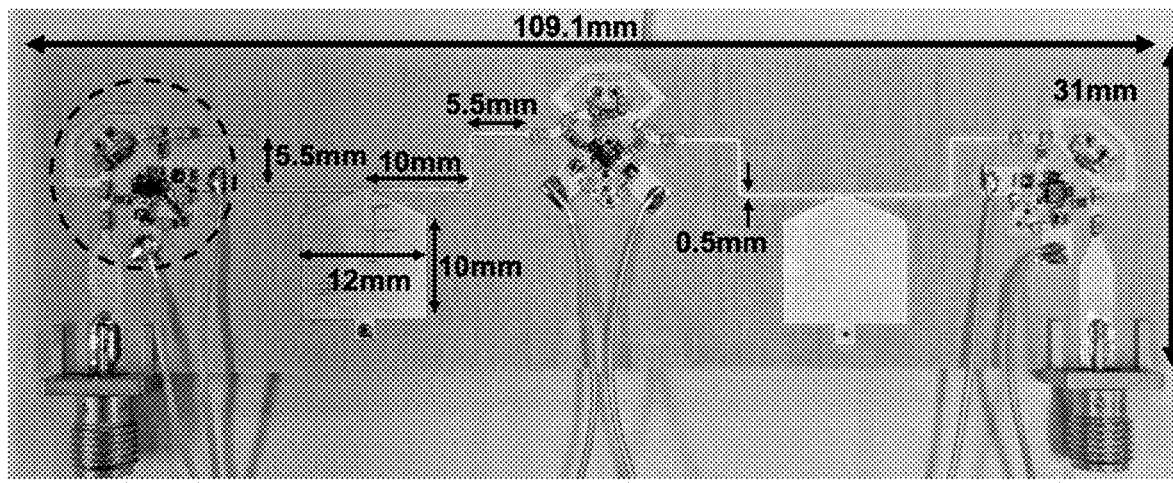
FIG. 21A is a photo of another prototype BPFI.
Figure 21B:
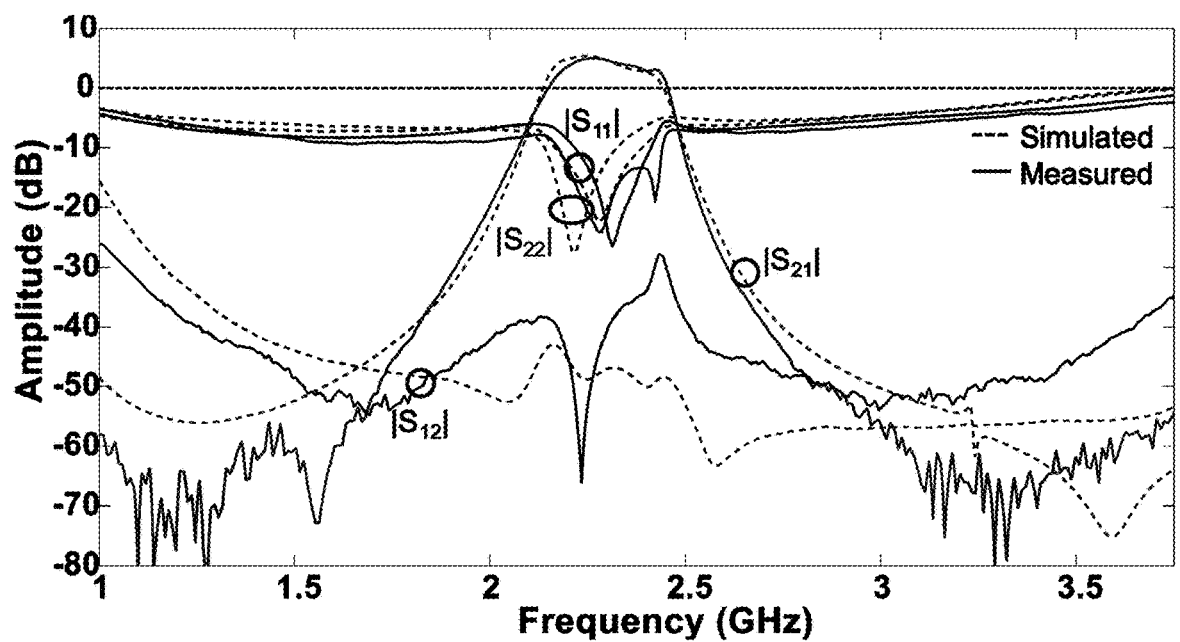
FIG. 21B is a plot showing measured and simulated S-parameters of this prototype.

FIG. 21A is a photo of another prototype BPFI based on Topology G CRD in FIG. 14. FIG. 21B is a plot showing measured and simulated S-parameters of this prototype. This five-pole series-cascaded BPFI was designed on a Rogers 4350B substrate with a center frequency of 2.3 GHz. The passive resonators were implemented using shorted stubs, the inverters were designed using meandered quarter-wavelength transmission lines, and the active resonators were based on the single cell in FIG. 7A. Its RF-measured and EM-simulated responses show a good agreement, thus validating the proposed five-pole BPFI. As shown, the RF performance of the prototype is summarized as follows: $f_{cen}$=2.3 GHz, FBW=11.9%, maximum gain=4.9 dB, $f_{cen}$ IS=53.1 dB, maximum in-band IS=70.8 dB, and minimum 1-dB BW IS=40.5 dB.

Figure 22A:
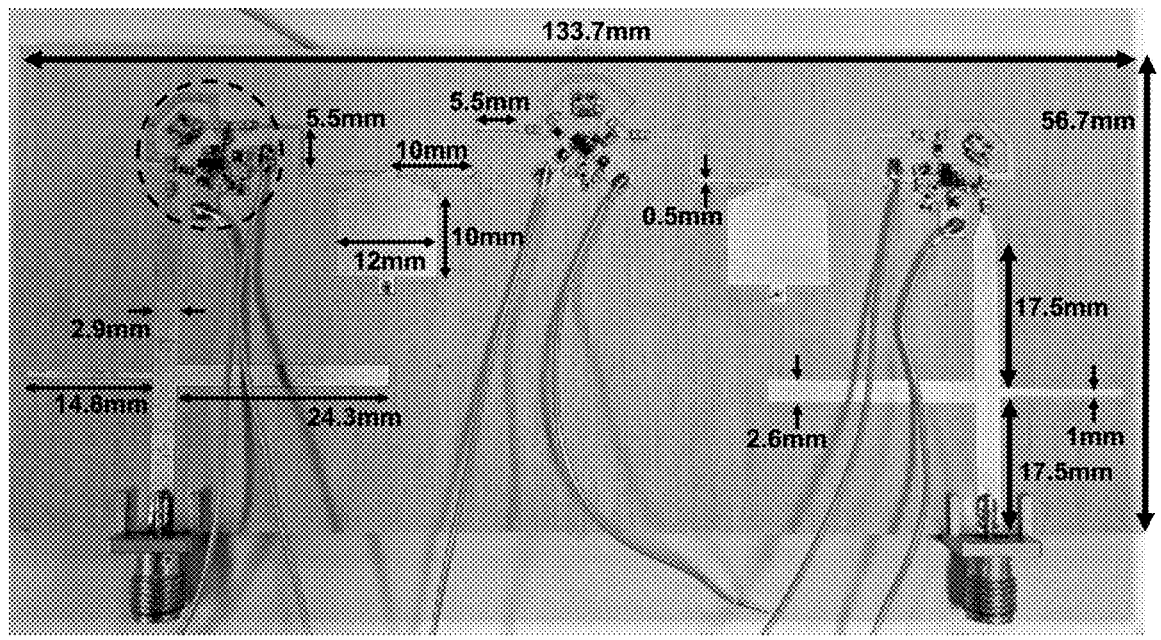
FIG. 22A is a photo of another prototype BPFI.
Figure 22B:
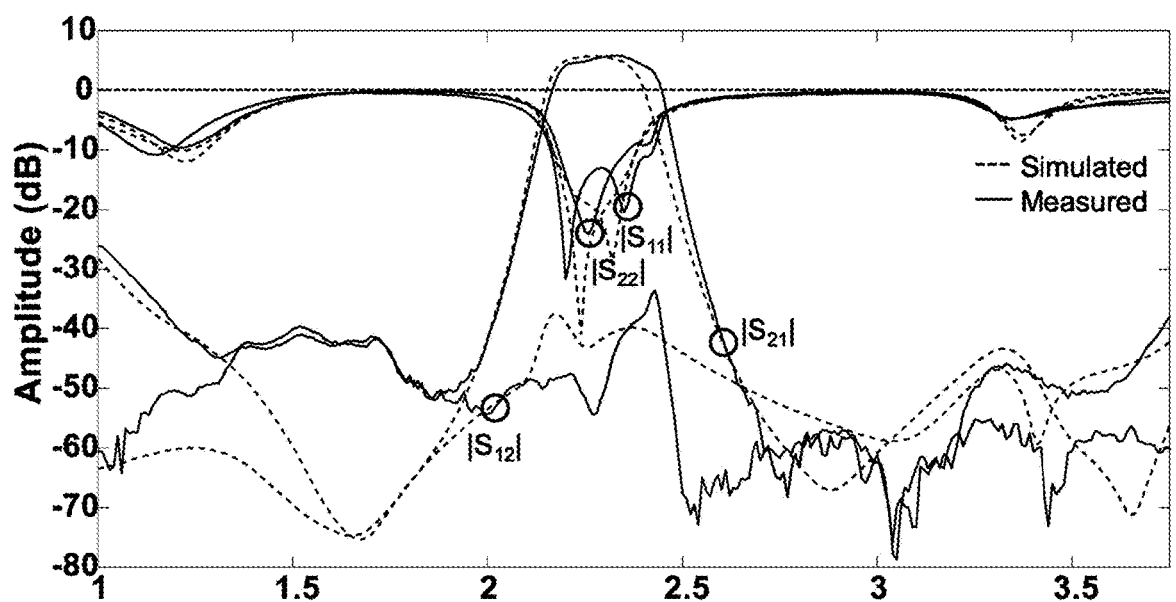
FIG. 22B is a plot showing measured and simulated S-parameters of this prototype.

FIG. 22A is a photo of another prototype BPFI based on Topology H CRD in FIG. 15. FIG. 22B is a plot showing measured and simulated S-parameters of this seventh order prototype. For its practical development, the prototype was built on a Rogers 4350B substrate. Passive resonators and the TZ generation cells were implemented using microstrip, and all inverters were designed using quarter wavelength-long-at-2.2-GHz transmission-line segments. The TZ generation cells were designed to resonate at 1.8 and 2.75 GHz. The RF-measured and EM-simulated responses of the seventh order BPFI prototype is shown in FIG. 22B which as it can be seen they show good agreement successfully validating the proposed concept. The RF performance can be summarized as follows: $f_{cen}$=2.3 GHz, FBW=10.7%, maximum gain=5.8 dB, $f_{cen}$ IS=48.7 dB, maximum in-band IS=59.7 dB, and minimum 1-dB BW IS=43.6 dB.

While the exemplary preferred embodiments of the present invention are described herein with particularity, those skilled in the art will appreciate various changes, additions, and applications other than those specifically mentioned, which are within the spirit of this invention.

What is claimed is:

1. A non-reciprocal RF filter comprising:
   a first non-reciprocal resonator; and
   a second resonator;
   wherein the first non-reciprocal resonator comprises—
   a transistor-based element; and
   a transmission line (TL)-based element having an opposite phase response to the transistor-based element and connected at two nodes with the transistor-based element;
   wherein the transistor-based element and the TL-based element are constructed and arranged such that a zero-phase resonance is achieved in the non-reciprocal resonator at a selected RF frequency.

2. The filter of claim 1 wherein the second resonator comprises either:
   a non-reciprocal resonator; or
   a passive resonator; or
   a multi-resonant cell.

3. The filter of claim 1 wherein the first non-reciprocal resonator and the second resonator are cascaded in series.

4. The filter of claim 3 comprising a second non-reciprocal resonator.

5. The filter of claim 4 configured to result in a single maximum isolation point.

6. The filter of claim 4 configured to result in two maximum isolation points.

7. The filter of claim 4 wherein the first non-reciprocal resonator, the second non-reciprocal resonator and the second resonator are cascaded in series.

8. The filter of claim 3 wherein the second resonator comprises either:
   a non-reciprocal resonator; or
   a passive resonator; or
   a multi-resonant cell.

9. The filter of claim 3 wherein the transistor-based element includes four resistors and a pHEMT transistor in common-source (CS) configuration that exhibits a positive phase response and the TL-based element exhibits a negative response.

10. The filter of claim 1 including an RF bandpass filter and an isolator within the same device volume.

11. The filter of claim 1 configured to result in gain.

12. The filter of claim 1 configured to not result in gain.

13. A non-reciprocal resonator comprising:
    a transistor-based element; and
    a TL-based element having an opposite phase response to the transistor-based element and connected at two nodes with the transistor-based element;
    wherein the transistor-based element and the TL-based element are constructed and arranged such that a zero-phase resonance is achieved in the non-reciprocal resonator at a selected RF frequency.

14. The non-reciprocal resonator of claim 13 wherein the transistor-based element includes four resistors and a pHEMT transistor in common-source (CS) configuration that exhibits a positive phase response, and the TL-based element exhibits a negative response.

15. The non-reciprocal resonator of claim 13 configured to result in gain.

16. The non-reciprocal resonator of claim 13 configured to result in no gain.

17. The non-reciprocal resonator of claim 13 configured to provide a center frequency and an isolation frequency that is different than the center frequency.

18. The method of modeling a non-reciprocal filter having a first non-reciprocal resonator comprising a transistor-based element and a TL-based element having an opposite phase response to the transistor-based element and connected at two nodes with the transistor-based element, wherein the transistor-based element and the TL-based element are constructed and arranged such that a zero-phase resonance is achieved in the non-reciprocal resonator at a selected RF frequency, and a second resonator as a coupled-resonant diagram comprising the steps of:
    modeling the non-reciprocal element using network parameters based on a coupling matrix, node admittances, resonating nodes;
    modeling any passive resonators; and
    modeling any multi-resonant cells.

19. The method of claim 18 wherein the network parameters include at least one of the following:
    S-parameters;
    Y-parameters;
    Z-parameters;
    ABCD parameters.

* * * * *